US012635328B1

(12) United States Patent
Lee

(10) Patent No.: US 12,635,328 B1
(45) Date of Patent: May 19, 2026

(54) ELECTRONIC DEVICE HAVING PLANAR OR CASCADED PHOTOSENSITIVE MATERIALS

(71) Applicant: Apple Inc., Cupertino, CA (US)

(72) Inventor: Hong Wei Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 609 days.

(21) Appl. No.: 17/560,099

(22) Filed: Dec. 22, 2021

Related U.S. Application Data

(60) Provisional application No. 63/137,995, filed on Jan. 15, 2021.

(51) Int. Cl.
| | |
|---|---|
| *H10K 39/32* | (2026.01) |
| *H10F 39/00* | (2025.01) |
| *H10F 39/12* | (2025.01) |
| *H10K 39/38* | (2023.01) |

(52) U.S. Cl.
CPC ........... *H10K 39/32* (2023.02); *H10F 39/191* (2025.01); *H10F 39/192* (2025.01); *H10F 39/193* (2025.01); *H10F 39/8053* (2025.01); *H10F 39/807* (2025.01); *H10K 39/38* (2023.02)

(58) Field of Classification Search
CPC ................ H10K 39/32; H01L 27/1463; H01L 27/14665; H01L 27/14667; H01L 27/14669; H10F 39/191–195; H10F 39/807
See application file for complete search history.

(56) References Cited

U.S. PATENT DOCUMENTS

| | | | |
|---|---|---|---|
| 4,350,886 | A | 9/1982 | Pommerrenig |
| 5,506,429 | A | 4/1996 | Tanaka et al. |
| 6,198,147 | B1 | 3/2001 | Connolly |
| 7,153,720 | B2 | 12/2006 | Augusto |
| 7,154,157 | B2 | 12/2006 | Bradski et al. |
| 7,164,113 | B2 | 1/2007 | Inokuma et al. |
| 7,432,540 | B2 | 10/2008 | McKee |
| 7,443,437 | B2 | 10/2008 | Altice, Jr. |
| 7,542,085 | B2 | 6/2009 | Altice, Jr. et al. |
| 7,551,059 | B2 | 6/2009 | Farrier |

(Continued)

FOREIGN PATENT DOCUMENTS

| | | |
|---|---|---|
| CN | 101637020 | 1/2010 |
| CN | 101998070 | 3/2011 |

(Continued)

OTHER PUBLICATIONS

Huang et al., "Extremely high-performance visible light photodetector in the Sb2SeTe2 nanoflake," *Scientific Reports*, 7:45413, 2017, pp. 1-7.

(Continued)

*Primary Examiner* — Brent A. Fairbanks
*Assistant Examiner* — Molly K Reida
(74) *Attorney, Agent, or Firm* — Brownstein Hyatt Farber Schreck, LLP

(57) ABSTRACT

An image sensor includes a semiconductor substrate, a set of epitaxial layers formed on the semiconductor substrate, pixel circuitry included within the set of epitaxial layers, a set of dielectric walls formed on the set of epitaxial layers, and a set of photosensitive materials disposed in one or more cavities formed by the set of dielectric walls and electrically connected to the pixel circuitry.

11 Claims, 13 Drawing Sheets

(56) References Cited

U.S. PATENT DOCUMENTS

| | | | |
|---|---|---|---|
| 7,671,435 B2 | 3/2010 | Ahn | |
| 7,714,917 B2 | 5/2010 | McKee | |
| 7,825,911 B2 | 11/2010 | Sano et al. | |
| 7,858,915 B2 | 12/2010 | McCarten | |
| 7,872,253 B2 | 1/2011 | Ohta et al. | |
| 7,872,287 B2 | 1/2011 | Masuoka et al. | |
| 7,943,904 B2 | 5/2011 | Ouvrier-Buffet | |
| 7,965,330 B2 | 6/2011 | Panicacci | |
| 8,026,966 B2 | 9/2011 | Altice | |
| 8,049,256 B2 | 11/2011 | Guidash | |
| 8,164,191 B2 | 4/2012 | Nakamura | |
| 8,169,011 B2 | 5/2012 | Oh | |
| 8,184,188 B2 | 5/2012 | Yaghmai | |
| 8,193,023 B2 | 6/2012 | Ahn | |
| 8,222,586 B2 | 7/2012 | Lee | |
| 8,310,003 B2 | 11/2012 | Kohyama | |
| 8,324,553 B2 | 12/2012 | Lee | |
| 8,400,625 B1 | 3/2013 | Young | |
| 8,462,249 B2 | 6/2013 | Shinohara | |
| 8,478,123 B2 | 7/2013 | Cao et al. | |
| 8,482,646 B2 | 7/2013 | Watanabe et al. | |
| 8,508,637 B2 | 8/2013 | Han et al. | |
| 8,514,308 B2 | 8/2013 | Itonaga et al. | |
| 8,525,287 B2 | 9/2013 | Tian et al. | |
| 8,530,820 B2 | 9/2013 | Matsunuma | |
| 8,531,567 B2 | 9/2013 | Roy et al. | |
| 8,570,409 B2 | 10/2013 | Choi et al. | |
| 8,637,800 B2 | 1/2014 | Kozlowski | |
| 8,642,306 B2 | 2/2014 | Nakada et al. | |
| 8,642,374 B2 | 2/2014 | Lyu et al. | |
| 8,643,750 B2 | 2/2014 | Mo et al. | |
| 8,669,132 B2 | 3/2014 | Lee | |
| 8,669,963 B2 | 3/2014 | Baker et al. | |
| 8,773,562 B1 | 7/2014 | Fan | |
| 8,792,035 B2 | 7/2014 | Yamada | |
| 8,912,624 B2 | 12/2014 | Kakehata | |
| 8,946,610 B2 | 2/2015 | Iwabuchi et al. | |
| 9,177,981 B2 | 11/2015 | Nishizawa | |
| 9,200,956 B2 | 12/2015 | Janesick | |
| 9,245,917 B2 | 1/2016 | Fan | |
| 9,348,165 B2 | 5/2016 | KuroKawa et al. | |
| 9,406,713 B2 | 8/2016 | Fan | |
| 9,451,131 B2 | 9/2016 | Umebayashi et al. | |
| 9,595,558 B2 | 3/2017 | Petilli | |
| 9,654,714 B2 | 5/2017 | He | |
| 9,741,754 B2 | 8/2017 | Li | |
| 9,749,553 B2 | 8/2017 | Borthakur et al. | |
| 9,847,359 B2 | 12/2017 | Belsher et al. | |
| 9,888,199 B2 | 2/2018 | Gomi et al. | |
| 9,917,218 B2 | 3/2018 | Kinge et al. | |
| 9,960,353 B2 | 5/2018 | Liang et al. | |
| 10,003,759 B2 | 6/2018 | Fan | |
| 10,128,285 B2 | 11/2018 | Ooki et al. | |
| 10,153,320 B2 | 12/2018 | Yamashita | |
| 10,181,488 B2 | 1/2019 | Gomi | |
| 10,186,546 B2 | 1/2019 | De Graff et al. | |
| 10,297,703 B2 | 5/2019 | Tian et al. | |
| 10,313,610 B2 | 6/2019 | Fu et al. | |
| 10,403,669 B2 | 9/2019 | Nagata et al. | |
| 10,462,402 B2 | 10/2019 | Fan | |
| 10,466,560 B2 | 11/2019 | Yamazaki et al. | |
| 10,468,383 B2 | 11/2019 | Shizukuishi | |
| 10,566,373 B2 | 2/2020 | Goto et al. | |
| 10,698,413 B2 | 6/2020 | Lau et al. | |
| 10,707,247 B2 | 7/2020 | Tian et al. | |
| 10,847,581 B2 | 11/2020 | Yamaguchi et al. | |
| 10,854,666 B2 | 12/2020 | Eum et al. | |
| 10,971,535 B2 | 4/2021 | Kim et al. | |
| 11,158,827 B2 | 10/2021 | Leem et al. | |
| 11,190,711 B2 | 11/2021 | Mogi | |
| 11,217,617 B2 | 1/2022 | Akiyama et al. | |
| 2003/0049925 A1 | 3/2003 | Layman et al. | |
| 2007/0019130 A1 | 1/2007 | Kuo | |
| 2007/0272828 A1 | 11/2007 | Xu | |
| 2009/0115878 A1 | 5/2009 | Mauritzson | |
| 2009/0179241 A1 | 7/2009 | Kawai et al. | |
| 2009/0322923 A1* | 12/2009 | Maehara | H10K 39/32 |
| | | | 257/E31.097 |
| 2011/0042552 A1 | 2/2011 | Furuya et al. | |
| 2014/0035082 A1* | 2/2014 | Chu | H01L 27/14689 |
| | | | 257/E31.124 |
| 2015/0221702 A1* | 8/2015 | Jung | H01L 27/14643 |
| | | | 257/40 |
| 2017/0012076 A1 | 1/2017 | Chen et al. | |
| 2017/0148841 A1* | 5/2017 | Matsumoto | H10F 39/199 |
| 2018/0358393 A1 | 12/2018 | Sato et al. | |
| 2020/0161456 A1 | 5/2020 | Leipold et al. | |
| 2020/0412980 A1 | 12/2020 | Agranov et al. | |

FOREIGN PATENT DOCUMENTS

| | | |
|---|---|---|
| CN | 102110700 | 6/2011 |
| CN | 104541372 | 4/2015 |
| CN | 105720130 | 6/2016 |
| EP | 1562233 | 8/2005 |
| EP | 2879181 | 6/2015 |
| JP | 59115681 | 7/1984 |
| JP | 2007134562 | 5/2007 |
| JP | 2007228460 | 9/2007 |
| JP | 2008010502 | 1/2008 |
| JP | 2009503896 | 1/2009 |
| JP | 2010212668 | 9/2010 |
| JP | 2011049445 | 3/2011 |
| JP | 2012114439 | 6/2012 |
| JP | 20139301 | 1/2013 |
| JP | 2018087969 | 6/2018 |
| WO | WO 09/034623 | 3/2009 |
| WO | WO 11/082126 | 4/2011 |
| WO | WO 13/118646 | 8/2013 |

OTHER PUBLICATIONS

Machida et al., "A 2.1Mpixel Organic-Film Stacked RGB-IR Image Sensor with Electrically Controllable IR Sensitivity," ISSCC 2017, Session 4, Imagers 4.7, 3 pages.

Procarione et al., "The optical properties of Sb2Se3—Sb2Te3," Phys. Stat. Sol., Department of Physics, Northern Illinois University, DeKalb, Illinois, vol. 42, No. 2, Jan. 1, 1970, pp. 871-878.

* cited by examiner

RED FILTER

BLUE FILTER

GREEN FILTER

300 ⟋ RED FILTER

302 ⟋ BLUE FILTER

304 ⟋ GREEN FILTER

306 ⟋ IR FILTER

ELECTRONIC DEVICE HAVING PLANAR OR CASCADED PHOTOSENSITIVE MATERIALS

CROSS-REFERENCE TO RELATED APPLICATION

This application is a nonprovisional of, and claims the benefit under 35 U.S.C. § 119(e) of, U.S. Provisional Patent Application No. 63/137,995, filed Jan. 15, 2021, the contents of which are incorporated herein by reference as if fully disclosed herein.

FIELD

The described embodiments relate generally to electronic devices and image sensors, and more particularly to electronic devices and image sensors that use photosensitive materials such as colloidal nanocrystals, quantum dots, organic photoconductors, or other photosensitive materials, which photosensitive materials may be film-based.

BACKGROUND

A device such as a camera (e.g., a digital camera) may at times include more than one type of sensor (or more generally, more than one type of electromagnetic radiation sensor). For example, a device may include a visible light sensor and an infrared (IR) sensor. In some cases, the IR sensor may be used to acquire an IR image, and the IR image may be used, for example, to adjust the colors or chrominance of a visible light image acquired by the visible light sensor (e.g., for color processing). An IR image may also be used as an input to adjust the focus of the visible light image; to boost low light sensitivity; to identify sources of heat that may affect the visible light image; to provide night vision; or for other purposes.

SUMMARY

Embodiments of the systems, devices, methods, and apparatus described in the present disclosure are directed to electronic devices having planar or cascaded photosensitive materials. In examples of planar photosensitive materials, photosensitive materials of different types may be deposited directly adjacent one another, in a single cavity, or in separate cavities separated by a grid of dielectric walls. In an example of cascaded photosensitive materials, different photosensitive materials may each be deposited in one or more cavities formed in different stacked layers, and pixel electrodes connected to one of the photosensitive materials may extend through dielectric walls that form cavities in which the other photosensitive material is deposited. In another example of cascaded photosensitive materials, different photosensitive materials may each be deposited in one or more cavities formed in different layers on different chips, and the different chips may be stacked and bonded to one another.

In a first aspect, the present disclosure describes an image sensor. The image sensor may include a semiconductor substrate, a set of epitaxial layers formed on the semiconductor substrate, pixel circuitry included within the set of epitaxial layers, a set of dielectric walls formed on the set of epitaxial layers, and a set of photosensitive materials disposed in one or more cavities formed by the set of dielectric walls and electrically connected to the pixel circuitry.

In a second aspect, the present disclosure describes an electronic device. The electronic device may include at least one layer that includes pixel circuitry, a first set of one or more layers stacked with the at least one layer that includes pixel circuitry, and a second set of one or more layers stacked with the at least one layer that includes pixel circuitry and the first set of one or more layers. The first set of one or more layers may include a grid of dielectric walls defining a set of cavities, and a first set of photosensitive materials disposed in the set of cavities. The second set of one or more layers may include a set of dielectric walls defining at least one cavity, and a second one or more photosensitive materials disposed in the at least one cavity. The electronic device may also include a first set of electrical connections between the first set of photosensitive materials and the pixel circuitry, and a second set of electrical connections between the second one or more photosensitive materials and the pixel circuitry. The second set of electrical connections may include a set of conductive vias extending through the set of dielectric walls.

In a third aspect, the present disclosure describes an electronic device. The electronic device may include a first chip and a second chip. The first chip may include a first epitaxial stack including first pixel circuitry, a first oxide stacked on the first epitaxial stack and having a first set of one or more cavities, a first set of one or more photosensitive materials disposed in the first set of one or more cavities, and a first set of electrical connections between the first set of one or more photosensitive materials and the first pixel circuitry. The second chip may be stacked on the first chip and include a second epitaxial stack including second pixel circuitry, a second oxide stacked on the second epitaxial stack and having a second set of one or more cavities, a second set of one or more photosensitive materials disposed in the second set of one or more cavities, and a second set of electrical connections between the second set of one or more photosensitive materials and the second pixel circuitry.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
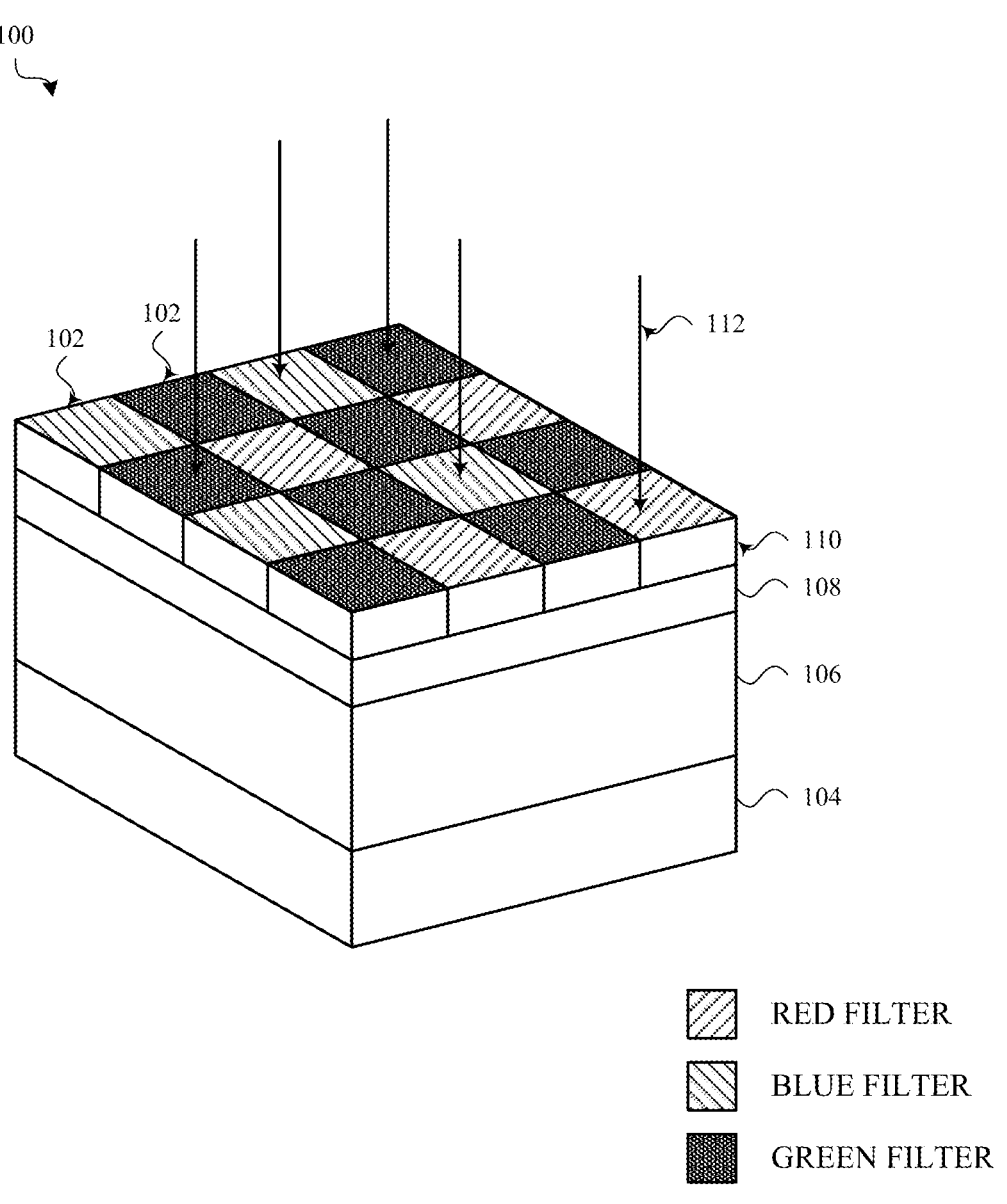
FIG. 1 shows a first example of an electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented between them, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Described herein are sensors having planar or cascaded photosensitive materials. In some embodiments, two or more different types of photosensitive materials are disposed in a single planar array. The different photosensitive materials may be directly adjacent one another, or different photosensitive materials may be disposed in different cavities with a grid of dielectric walls separating different types and portions of photosensitive material. In other embodiments, photosensitive materials may be cascaded—i.e., disposed in different, stacked, planar arrays. In these embodiments, the same type of photosensitive material may be included in each layer, or different photosensitive materials may be included in different layers. In each layer, the photosensitive material may be deposited in a single cavity or in multiple cavities. Cascaded embodiments may be formed by progressively building a single stack of layers/components on a single semiconductor substrate, or by building first and second stacks on first and second substrates, and then stacking and bonding first and second chips including the first and second stacks.

These and other embodiments are discussed below with reference to FIGS. 1-12. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

As used herein, a "substrate" refers to a block or mass of common material. As used herein, a "layer" refers to one or more materials that are typically, but not necessarily, parallel to the top surface and/or bottom surface of a substrate or another layer. As used herein, a component, material, or layer that is "stacked" on another component, material, or layer may be formed directly on the other component, material, or layer, or may be attached to and separated from the other component, material, or layer by one or more other components, materials, or layers in a common "stack." The terms "on" and "directly on" are used interchangeably herein.

FIG. 1 shows a first example of an electronic device 100 (e.g., an image sensor). The electronic device 100 may be a stand-alone device or a device that can be integrated into another electronic device (e.g., a smartphone, an electronic watch, a tablet computer, a vehicle or vehicle navigation system, and so on).

The electronic device 100 may include an M×N array of pixels 102, where M and N are integers greater than or equal to 1. In some embodiments, different pixels 102 may be associated with different color filters 110, such as red, blue, and green color filters (or cyan, magenta, yellow, and black color filters, or other types of color filters). When the pixels are associated with red, blue, and green color filters, the color filters 110 may be arranged in a Bayer color filter pattern. In other embodiments, different pixels 102 may be associated with different color filters 110 that do not necessarily (but may) differ by color. For example, some pixels 102 may be associated with color filters of one or more type, for sensing different ranges of visible light wavelengths, and other pixels 102 may be associated with infrared (IR) filters, for sensing a range (or different ranges) of IR wavelengths. In other embodiments, all of the pixels 102 may be associated with the same type of light filter (e.g., in the case of a monochromatic sensor, or a sensor that only senses infrared light) or no filter.

In some embodiments, the electronic device 100 may include a substrate 104 on which a set of epitaxial layers 106 including pixel circuitry is formed (e.g., grown and/or deposited). One or more photosensitive materials 108 may be deposited on and connected to the pixel circuitry. The photosensitive material(s) 108 may include, for example, colloidal nanocrystals, quantum dots, organic photoconductors, or other photosensitive materials, which materials may be film-based. In some cases, a photosensitive material 108 may be configured in different ways (e.g., doped) to sense different wavelengths of light 112, and photosensitive materials 108 that are configured to sense different wavelengths of light 112 may be arranged in an array on the electronic device 100. In other cases, a single type of photosensitive material 108 may be deposited on the electronic device 100, and monochromatic sensing may be performed. In other cases, a single type of photosensitive material 108, configured to sense a broad range of wavelengths of light 112, may be deposited on the electronic device 100 and color filters 110 may be used to control which wavelengths of light are sensed by which pixels 102.

In some cases, additional layers of filters, photosensitive materials, pixel circuitry, lenses, and so on may be stacked on (or with) the components illustrated in FIG. 1.

Figure 2:
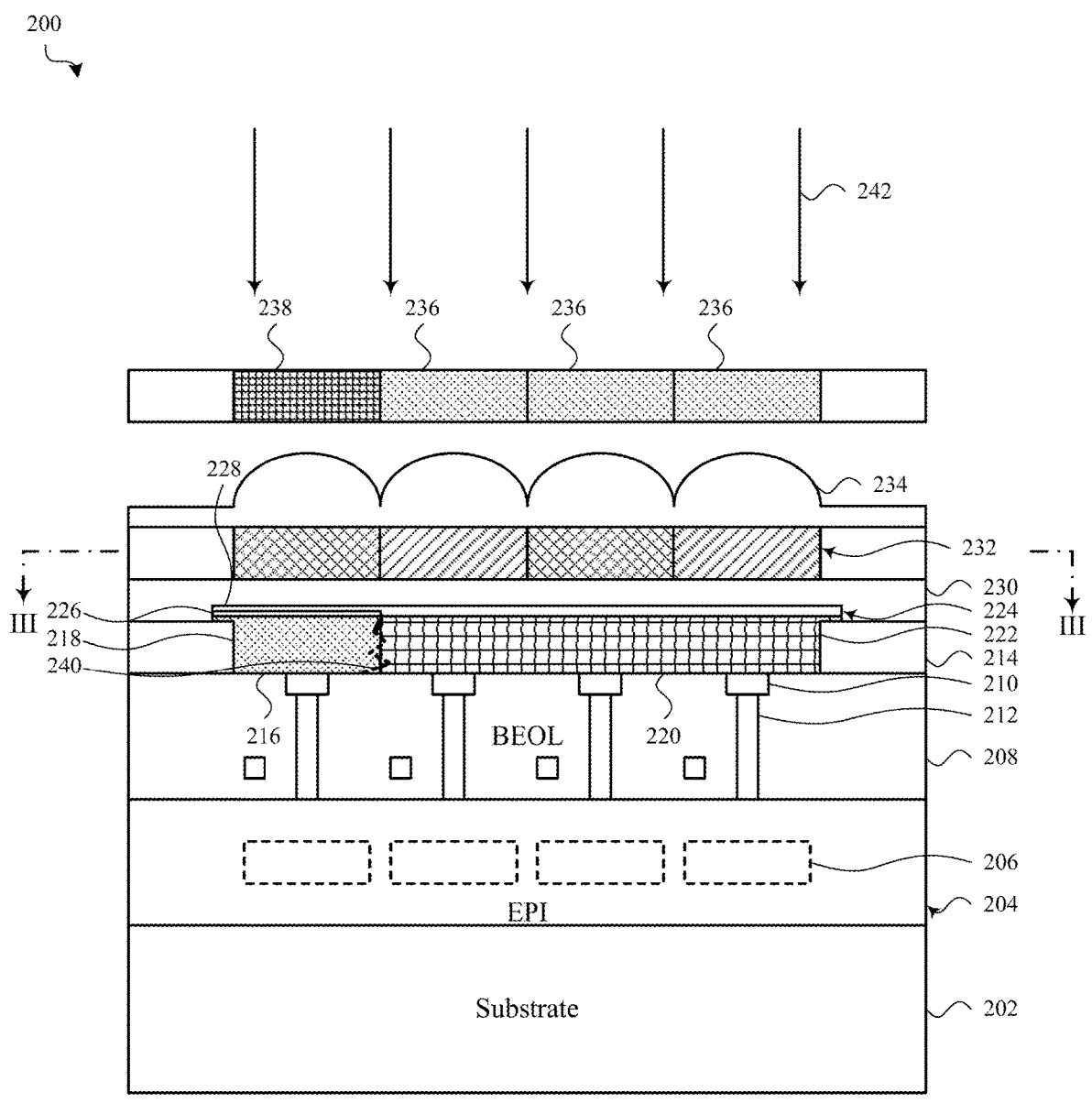
FIG. 2 shows a second example of an electronic device.

FIG. 2 shows a second example of an electronic device 200 (e.g., an image sensor). The electronic device 200 may be the electronic device described with reference to FIG. 1 or another form of electronic device. The electronic device 200 may be a stand-alone device or a device that can be integrated into another electronic device (e.g., a smartphone, an electronic watch, a tablet computer, a vehicle or vehicle navigation system, and so on).

The electronic device 200 may include a semiconductor substrate 202 (e.g., a silicon (Si) substrate) on which a set of epitaxial layers 204 is formed (e.g., grown). Pixel circuitry 206 may be included in the set of epitaxial layers 204. The pixel circuitry 206 may include, for example, analog and/or digital complementary metal-oxide semiconductor (CMOS) circuitry (e.g., charge processing and charge converting circuitry, including analog-to-digital converters and so on).

Back end of line (BEOL) metal layers and oxides 208 may be formed on the set of epitaxial layers 204 (e.g., on one or more surfaces of the set of epitaxial layers 204, opposite the semiconductor substrate 202). A set of pixel electrodes 210 may be formed on one or more surfaces of the BEOL metal layers and oxides 208, opposite the set of epitaxial layers 204. A set of conductive vias 212 may extend through the BEOL metal layers and oxides 208, and may electrically connect the set of pixel electrodes 210 to the pixel circuitry 206 (e.g., different pixel electrodes in the set of pixel electrodes 210 may be electrically connected to different sets of pixel circuitry associated with different pixels of an image sensor).

One or more layers of dielectric 214, such as one or more layers of oxide (e.g., silicon dioxide ($SiO_2$)) may be deposited on the BEOL metal layers and oxides 208 and set of pixel electrodes 210. In some cases, the layer(s) of dielectric 214 may be deposited as a contiguous layer, and then portions of the dielectric 214 may be etched away to form a cavity 216 (e.g., a trench, such as a generally rectangular or square trench) bounded by a set of dielectric walls. Formation of the cavity 216 (or a secondary process) may expose the set of pixel electrodes 210 within the cavity 216. A first photosensitive material 218 may then be deposited in the cavity 216.

In some embodiments, the first photosensitive material 218 may only fill a part (or portions) of the cavity 216, and the cavity 216 may be shared with a second photosensitive material 222 (i.e., the cavity 216 may be a shared cavity). This may be achieved, for example, by filling the cavity 216 with the first photosensitive material 218 such that the first photosensitive material 218 overfills and extends past, and over, the walls of the cavity 216, and then removing (e.g., etching away) part or portions of the first photosensitive material 218 to create a secondary cavity or cavities 220. A second photosensitive material 222 may then be deposited in the secondary cavity(ies) 220, and in some cases may overfill and extend past, and over, one or more walls or wall portions of the cavity 216. However, the second photosensitive material 222 should not overlap the top of the first photosensitive material 218, or should be planarized, etched, or otherwise finished so that it does not overlap the top of the first photosensitive material 218 (e.g., to mitigate optical crosstalk during sensing).

In some cases, the first photosensitive material 218 may have a first type, and the second photosensitive material 222 may have a second type different from the first type (e.g., the first photosensitive material 218 may be configured to sense infrared light (e.g., near infrared (NIR) light, such as NIR light greater than 750 nanometers (nm), or greater than 1100 nm, or greater than 1310 nm, or greater than 1550 nm), and the second photosensitive material 222 may be configured to sense visible light).

The depositions of the first and second photosensitive materials 218, 222 may electrically connect the set of pixel electrodes 210 to the first and second photosensitive material 218, 222 (i.e., to the set of photosensitive materials 218, 222). A common electrode 224 may be electrically connected to surfaces of the set of photosensitive materials 218, 222, opposite surfaces of the photosensitive materials 218, 222 to which the set of pixel electrodes 210 is electrically connected. The common electrode 224 may extend over the set of photosensitive materials 218, 222 and portions (walls) of the dielectric 214. In some embodiments, the common electrode 224 may include multiple layers. A first layer 226 of the common electrode 224 may be deposited over portions of the first photosensitive material 218 that are to be retained, prior to etching other portions of the first photosensitive material 218 away to form the secondary cavity (ies) 220. In this manner, the first layer 226 of the common electrode 224 may form an etch mask. A second layer 228 of the common electrode 224 may be deposited after the second photosensitive material 222 has been deposited, and may be deposited over the first layer 226 of the common electrode 224, the second photosensitive material 222, and portions (walls) of the dielectric 214. The second photosensitive material 222 may then be patterned, using photoresist and the common electrode 224 as an etch mask. The common electrode 224 (or first and second layers 226, 228 of the common electrode 224) may include, for example indium tin oxide (ITO), indium tungsten oxide (IWO), and/or indium gallium zinc oxide (IGZO).

Figure 3:
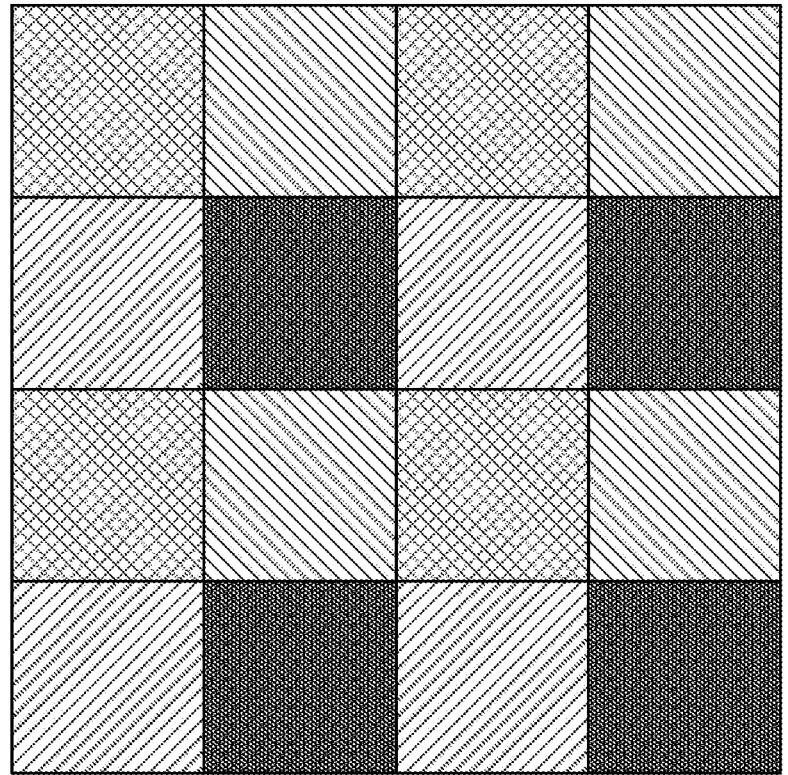
FIG. 3 shows an example of a light filter array.
Figure 3:
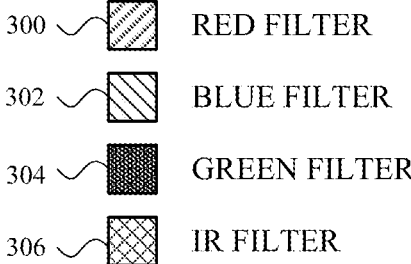

A passivation layer 230 may be deposited on the common electrode 224 and extend past edges of the common electrode 224. A light filter array 232 may be formed on the passivation layer 230. In some cases, the light filter array 232 may include a mix of visible (e.g., red, green, and blue) and infrared filters. For example, and as shown in FIG. 3 (taken along cut line III-III in FIG. 2), the light filter array 232 may include red, green, blue, and infrared filters 300, 302, 304, 306 that, respectively, pass only (or primarily) red, green, blue, and infrared light. In some cases, the infrared filter 306 may be disposed over, and in some cases may be aligned with, the first photosensitive material 218, and the visible filters 300, 302, 304 may be disposed over, and in some cases aligned with, the second photosensitive material 222.

An array of lenses 234 (e.g., a micro-lens array or gradient-index (GRIN) lens array) may be disposed over, and in some cases may be aligned with, the different filters of the light filter array 232. When the first photosensitive material 218 is configured to sense infrared light, and the second photosensitive material 222 is configured to sense visible light, infrared cut filters 236 may be disposed over the visible light-sensing pixels of the electronic device 200 (i.e., in the light-receiving paths of a first subset of photosensitive materials), and infrared pass filters 238 (or no filters) may be disposed over the infrared light-sensing pixels of the electronic device 200. Similarly, but not shown, visible light cut filters may be disposed over the infrared light-sensing pixels, and visible light pass filters (or only the infrared cut filters 236) may be disposed over the visible light pixels.

Although the electronic device 200 is shown to include a limited number of pixels, the number of pixels may be expanded to 100s, 1000s, or millions of pixels. Conversely, the electronic device 200 may have fewer pixels than shown.

Although the border shown between the first and second photosensitive materials 218, 222 (and any other borders between the first and second photosensitive materials 218, 222) is preferably a horizontal wall, the exposure of the first photosensitive material 218 to etch/strip chemistry may leave the border(s) 240 between the first and second photosensitive materials 218, 222 irregular (e.g., jagged) and/or change or degrade the properties of the first photosensitive material 218. As a result, there may be optical crosstalk between, and/or quantum efficiency (QE) loss for, the pixels adjacent the border(s) between the first and second photosensitive materials 218, 222.

The electronic device 200 is shown to integrate two photosensitive materials in a single cavity (or trench), in a single planar array. In alternative embodiments, more than two photosensitive materials may be integrated within a single cavity (or trench). Each of the photosensitive materials may have different properties (e.g., be configured to sense different wavelengths of light 242). Pixel circuitry for all of the photosensitive materials may be included in a single set of epitaxial layers 204 (i.e., in a single epitaxial stack).

Figure 4:
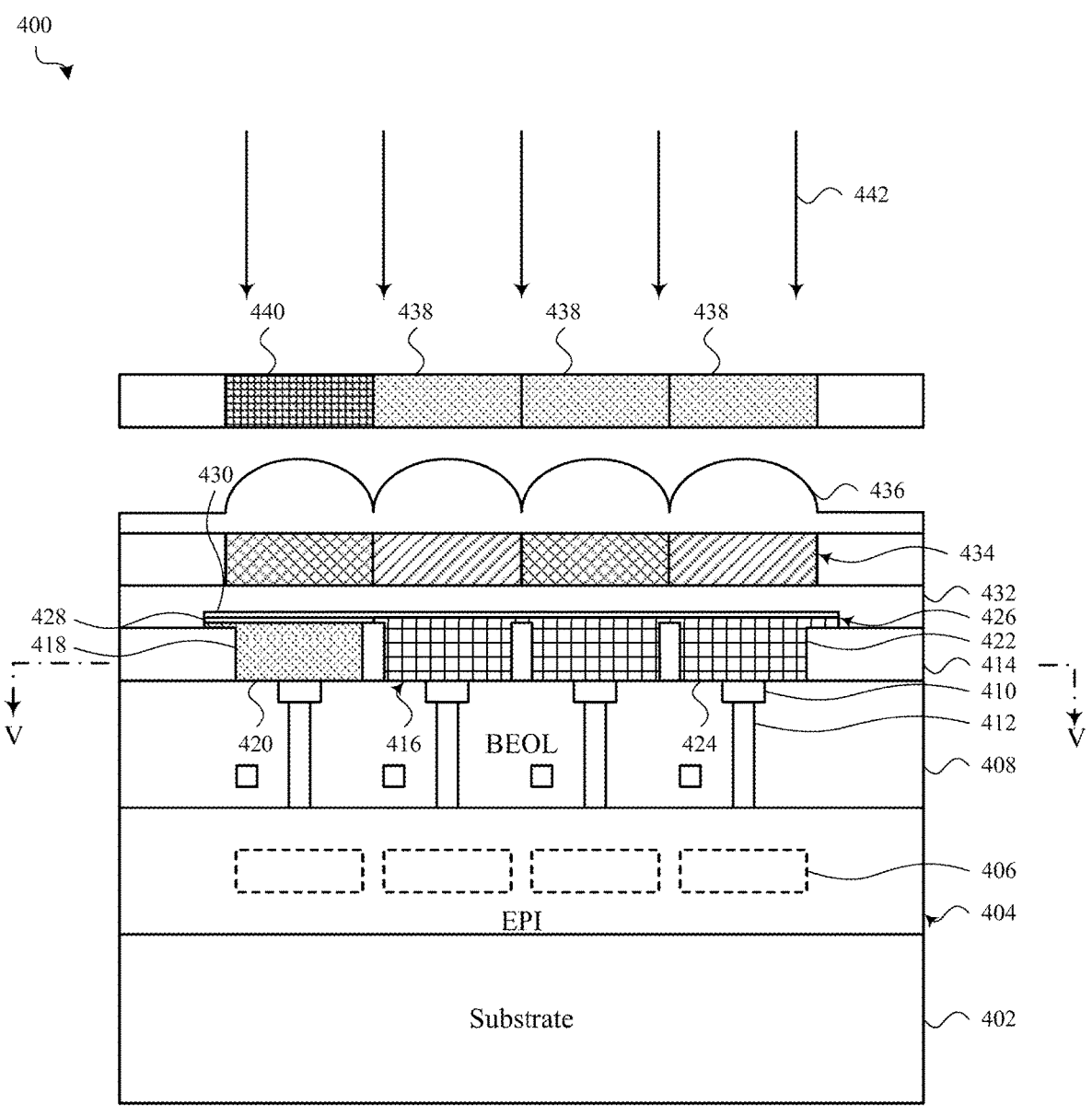
FIG. 4 shows a third example of an electronic device.

To mitigate optical crosstalk and photosensitive material edge damage (e.g., over what may occur in the electronic device described with reference to FIG. 2), FIG. 4 shows a third example of an electronic device 400 (e.g., an image sensor). The electronic device 400 may be the electronic device described with reference to FIG. 1 or another form of electronic device. The electronic device 400 may be a stand-alone device or a device that can be integrated into another electronic device (e.g., a smartphone, an electronic watch, a tablet computer, a vehicle or vehicle navigation system, and so on).

The electronic device 400 may include a semiconductor substrate 402 (e.g., a Si substrate) on which a set of epitaxial layers 404 is formed (e.g., grown). Pixel circuitry 406 may be included in the set of epitaxial layers 404. The pixel circuitry 406 may include, for example, analog and/or digital CMOS circuitry (e.g., charge processing and charge converting circuitry, including analog-to-digital converters and so on).

BEOL metal layers and oxides 408 may be formed on the set of epitaxial layers 404 (e.g., on one or more surfaces of the set of epitaxial layers 404, opposite the semiconductor substrate 402). A set of pixel electrodes 410 may be formed on one or more surfaces of the BEOL metal layers and oxides 408, opposite the set of epitaxial layers 404. A set of conductive vias 412 may extend through the BEOL metal layers and oxides 408, and may electrically connect the set of pixel electrodes 410 to the pixel circuitry 406 (e.g., different pixel electrodes in the set of pixel electrodes 410 may be electrically connected to different sets of pixel circuitry associated with different pixels of an image sensor).

One or more layers of dielectric 414, such as one or more layers of oxide (e.g., SiO₂) may be deposited on the BEOL metal layers and oxides 408 and set of pixel electrodes 410. In some cases, the layer(s) of dielectric 414 may be deposited as a contiguous layer, and then portions of the dielectric 414 may be etched away to form a set of cavities 416 (e.g., trenches, such as generally rectangular or square trenches)

bounded by a set of dielectric walls (e.g., a grid of dielectric walls defining the set of cavities 416). Formation of the set of cavities 416 (or a secondary process) may expose the set of pixel electrodes 410 to the set of cavities 416.

Figure 5:
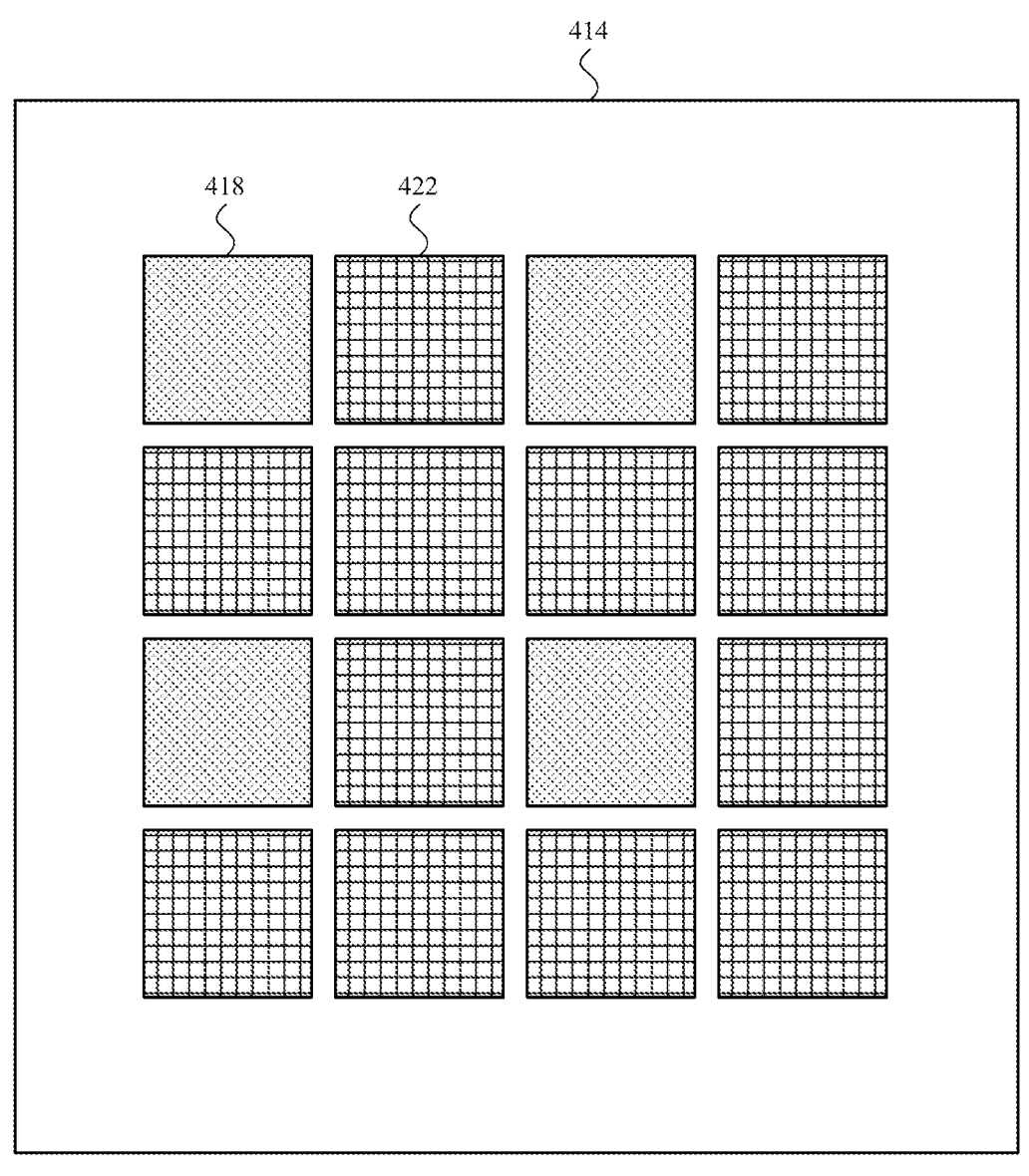
FIG. 5 shows an example plan view of a grid of dielectric walls in which photosensitive materials are disposed.

A first photosensitive material 418 may be deposited in a first subset of cavities in the set of cavities 416. The first subset of cavities may include a first cavity 420. The first photosensitive material 418 may overfill and extend past, and over, the walls of the cavities that it fills (e.g., over the dielectric walls around the first cavity 420). A second photosensitive material 422 may be deposited in a second subset of cavities in the set of cavities 416. The second subset of cavities may include a second cavity 424. The second photosensitive material 422 may overfill and extend past, and over, the walls of the cavities that it fills (e.g., over the dielectric walls around the cavity 424). An example plan view of the dielectric 414, the grid of dielectric walls, and the first and second photosensitive materials 418, 422 is shown in FIG. 5 (taken along cut line V-V in FIG. 4).

The dielectric 414 functions as an optical confinement element for the first and second photosensitive materials 418, 422. More particularly, the grid of dielectric walls formed by the dielectric 414 function as optical confinement elements for different pixels of the electronic device 400, with different pixels including a different portion of the first or second photosensitive materials 418, 422. The optical confinement is at least partially due to the dielectric 414 having a lower index than the first and second photosensitive materials 418, 422, which creates a contrasting index that results in total internal reflection (TIR) of light 442 received by the photosensitive material 418 or 422 deposited within a cavity 416. The dielectric 414, in combination with the first and/or second layer 428, 430 of the common electrode 426, also provides physical protection for the edges, top surfaces, and bottom surfaces of the first and second photosensitive materials 418, 422, so that the jagged transitions between photosensitive materials and/or film damage described with reference to FIG. 2 can be reduced or prevented.

In some cases, the first photosensitive material 418 may have a first type, and the second photosensitive material 422 may have a second type different from the first type (e.g., the first photosensitive material 418 may be configured to sense infrared light (e.g., near infrared (NIR) light, such as NIR light greater than 750 nm, or greater than 1100 nm, or greater than 1310 nm, or greater than 1550 nm), and the second photosensitive material 422 may be configured to sense visible light).

The depositions of the first and second photosensitive materials 418, 422 may electrically connect the set of pixel electrodes 410 to the first and second photosensitive materials 418, 422 (i.e., to the set of photosensitive materials 418, 422). A common electrode 426 may be electrically connected to surfaces of the set of photosensitive materials 418, 422, opposite surfaces of the photosensitive materials 418, 422 to which the set of pixel electrodes 410 is electrically connected. The common electrode 426 may extend over the set of photosensitive materials 418, 422 and portions (walls) of the dielectric 414. In some embodiments, the common electrode 426 may include multiple layers. A first layer 428 of the common electrode 426 may be deposited over the first photosensitive material 418, or over portions of the first photosensitive material 418 that are to be retained if the first photosensitive material 418 is deposited in all of the cavities 420, 424 defined by the dielectric 414 and then etched away where not needed. In this manner, the first layer 428 of the common electrode 426 may form an etch mask. The first layer 428 of the common electrode 426 also protects the portions of the first photosensitive material 418 that are to be retained from etch damage (e.g., because the portions of the first photosensitive material 418 that are to be retained are surrounded—or mostly surrounded—by the dielectric 414 and the first layer 428 of the common electrode 426). A second layer 430 of the common electrode 426 may be deposited after the second photosensitive material 422 has been deposited, and may be deposited over the first layer 428 of the common electrode 426, the second photosensitive material 422, and the grid of dielectric walls formed by the dielectric 414. The second photosensitive material 422 may then be patterned, using photoresist and the common electrode 426 as an etch mask. The common electrode 426 protects both the first and second photosensitive materials 418, 422 from etch damage (e.g., because the first and second photosensitive materials 418, 422 are surrounded—or mostly surrounded—by the dielectric 414 and the first and second layers 428, 430 of the common electrode 426). The common electrode 426 (or first and second layers 428, 430 of the common electrode 426) may include, for example ITO, IWO, and/or IGZO.

A passivation layer 432 may be deposited on the common electrode 426 and extend past edges of the common electrode 426. A light filter array 434 may be formed on the passivation layer 432. In some cases, the light filter array 434 may include a mix of visible (e.g., red, green, and blue) and infrared filters. For example, the light filter array 434 may include red, green, blue, and infrared filters 300, 302, 304, 306, as shown in FIG. 3. In some cases, the infrared filter 306 may be disposed over, and in some cases may be aligned with, the first photosensitive material 418, and the visible filters 300, 302, 304 may be disposed over, and in some cases aligned with, the second photosensitive material 422.

An array of lenses 436 (e.g., a micro-lens array or GRIN lens array) may be disposed over, and in some cases may be aligned with, the different filters of the light filter array 434. When the first photosensitive material 418 is configured to sense infrared light, and the second photosensitive material is configured to sense visible light, infrared cut filters 438 may be disposed over the visible light-sensing pixels of the electronic device 400, and infrared pass filters 440 (or no filters) may be disposed over the infrared light-sensing pixels of the electronic device 400. Similarly, but not shown, visible light cut filters may be disposed over the infrared light-sensing pixels, and visible light pass filters (or only the infrared cut filters 438) may be disposed over the visible light pixels.

Although the electronic device 400 is shown to include a limited number of pixels, the number of pixels may be expanded to 100s, 1000s, or millions of pixels. Conversely, the electronic device 400 may have fewer pixels than shown.

The electronic device 400 is shown to integrate two photosensitive materials in a single planar array. In alternative embodiments, more than two photosensitive materials may be integrated within a set of cavities 416. Each of the photosensitive materials may have different properties (e.g., be configured to sense different wavelengths of light). Pixel circuitry for all of the photosensitive materials may be included in a single set of epitaxial layers 404 (i.e., in a single epitaxial stack). A low index grid of dielectric walls can provide TIR for higher QE and angular confinement.

Figure 6:
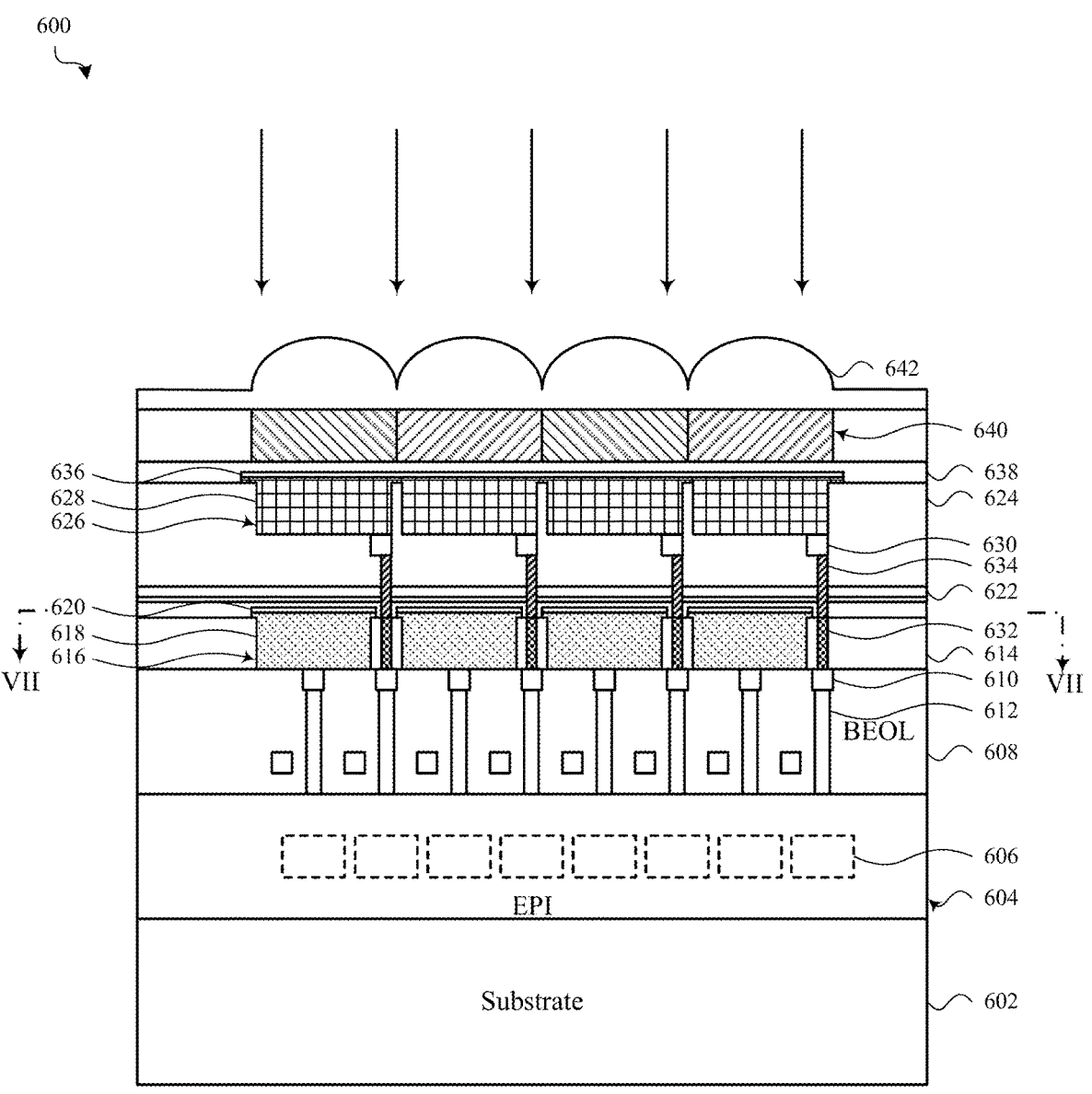
FIG. 6 shows a fourth example of an electronic device.

FIG. 6 shows a fourth example of an electronic device 600 (e.g., an image sensor). The electronic device 600 may be the electronic device described with reference to FIG. 1 or another form of electronic device. The electronic device 600 may be a stand-alone device or a device that can be integrated into another electronic device (e.g., a smartphone, an electronic watch, a tablet computer, a vehicle or vehicle navigation system, and so on). In contrast to the electronic devices described with reference to FIGS. 2 and 4, the electronic device 600 has two layers of photosensitive materials.

The electronic device 600 may include a semiconductor substrate 602 (e.g., a Si substrate) on which a set of epitaxial layers 604 is formed (e.g., grown). Pixel circuitry 606 may be included in the set of epitaxial layers 604. The pixel circuitry 606 may include, for example, analog and/or digital CMOS circuitry (e.g., charge processing and charge converting circuitry, including analog-to-digital converters and so on).

BEOL metal layers and oxides 608 may be formed on the set of epitaxial layers 604 (e.g., on one or more surfaces of the set of epitaxial layers 604, opposite the semiconductor substrate 602). A set of pixel electrodes 610 may be formed on one or more surfaces of the BEOL metal layers and oxides 608, opposite the set of epitaxial layers 604. A set of conductive vias 612 may extend through the BEOL metal layers and oxides 608, and may electrically connect the set of pixel electrodes 610 to the pixel circuitry 606 (e.g., different pixel electrodes in the set of pixel electrodes 610 may be electrically connected to different sets of pixel circuitry associated with different pixels of an image sensor).

One or more layers of dielectric 614, such as one or more layers of oxide (e.g., $SiO_2$) may be deposited on the BEOL metal layers and oxides 608 and set of pixel electrodes 610. In some cases, the layer(s) of dielectric 614 may be deposited as a contiguous layer, and then portions of the dielectric 614 may be etched away to form a set of cavities 616 (e.g., trenches, such as generally rectangular or square trenches) bounded by a set of dielectric walls (e.g., a grid of dielectric walls defining the set of cavities 616). Formation of the set of cavities 616 (or a secondary process) may expose the set of pixel electrodes 610 to the set of cavities 616.

A first photosensitive material 618 may be deposited in the set of cavities 616. The first photosensitive material 618 may overfill and extend past, and over, the walls of the cavities 616. The dielectric 614 may function similarly to the dielectric described with reference to FIG. 4. After deposition, the deposited first photosensitive material 618 may be considered a set of photosensitive materials, with the photosensitive material deposited in each cavity being considered a separate photosensitive material corresponding to a separate pixel. Of note, however, the set of photosensitive materials may be a disconnected set of photosensitive materials or a connected set of photosensitive materials, depending on whether the first photosensitive material 618 is deposited on the dielectric walls that define the set of cavities 616, such that the photosensitive materials in different cavities 616 are connected.

The deposition of the first photosensitive material 618 may electrically connect a first subset of the set of pixel electrodes 610 to the first photosensitive material 618. A common electrode 620 may be electrically connected to surfaces of the first photosensitive material 618, opposite surfaces of the photosensitive material 618 to which the set of pixel electrodes 610 is electrically connected. The common electrode 620 may extend over the first photosensitive material 618 and portions (walls) of the dielectric 614. The common electrode 620 may be deposited over the first photosensitive material 618 and the grid of dielectric walls formed by the dielectric 614. The first photosensitive material 618 may then be patterned, using photoresist and the common electrode 620 as an etch mask. The common electrode 620 protects both the first photosensitive material from etch damage (e.g., because the first photosensitive material 618 is surrounded—or mostly surrounded—by the dielectric 614 and the common electrode 620). The common electrode 620 may include, for example ITO, IWO, and/or IGZO.

Optionally, one or more layers of light filter 622 may be deposited over the common electrode 620, to filter out or block light that the first photosensitive material is not configured to sense. For example, if the first photosensitive material 618 is configured to detect infrared light, the layer(s) of light filter 622 may be configured as a visible light blocking filter and/or a filter that blocks other non-infrared light. The layer(s) of light filter 622 may provide a passivation layer, or a passivation layer may be added between the common electrode 620 and layer(s) of light filter 622.

One or more additional layers of dielectric 624, such as one or more layers of oxide (e.g., SiO$_2$) may be deposited on the layer(s) of light filter 622 (or if the layer(s) of light filter 622 are not used, the layer(s) of dielectric 624 may be deposited on the common electrode 620, or on a passivation layer positioned where the layer(s) of light filter 622 are shown). In some cases, the layer(s) of dielectric 624 may be deposited as a contiguous layer, and then portions of the dielectric 624 may be etched away to form a set of cavities 626 (e.g., trenches, such as generally rectangular or square trenches) bounded by a set of dielectric walls (e.g., a grid of dielectric walls defining the set of cavities 626).

A second photosensitive material 628 may be deposited in the set of cavities 626. The second photosensitive material 628 may overfill and extend past, and over, the walls of the set of cavities 626. After deposition, the deposited second photosensitive material 628 may be considered a set of photosensitive materials, with the photosensitive material deposited in each cavity being considered a separate photosensitive material corresponding to a separate pixel. Of note, however, the set of photosensitive materials may be a disconnected set of photosensitive materials or a connected set of photosensitive materials, depending on whether the second photosensitive material 628 is deposited on the dielectric walls that define the set of cavities 626, such that the photosensitive materials in different cavities 626 are connected.

The dielectric 624 may function similarly to the dielectric described with reference to FIG. 4. Alternatively, a single cavity may be formed in the dielectric 624, and the second photosensitive material 628 may be deposited in the single cavity (and may also overfill and extend past, and over, the walls of the single cavity). The second photosensitive material 628 may be highly transmissive (or transparent) to a type of light sensed by the first photosensitive material 618 (e.g., infrared light).

The second photosensitive material 628 may be electrically connected to the pixel circuitry 606 included in the set of epitaxial layers 604. The electrical interconnect between the second photosensitive material 628 and the pixel circuitry 606 may include a set of pixel electrodes 630 formed on a layer of dielectric 624. The set of pixel electrodes 630 may be formed before or after formation of the set of cavities 626 (or alternatively, before the formation of a single cavity in the dielectric 624). Each pixel electrode in the set of pixel electrodes 630 may be electrically connected to a corresponding pixel electrode in a second subset of the set of pixel electrodes 610. Corresponding pixel electrodes in the first and second sets of pixel electrodes 610, 630 may be electrically connected by one or more conductive vias (e.g., first and second conductive vias 632, 634), which conductive vias 632, 634 may form different portions of an electrical connection between the pixel electrodes in the second set of pixel electrodes 630 and the pixel circuitry 606. For example, a first conductive via 632 may extend through the dielectric 614 (e.g., within a dielectric wall of the grid of dielectric walls) and electrically connect to a pixel electrode in the set of pixel electrodes 610. Conductive vias 632 may be formed (deposited and etched) prior to deposition of the one or more layers of dielectric 614, or may be built up before or after the deposition of each of a number of layers of dielectric 614, or may be formed by etching or otherwise forming passages through the dielectric 614 and filling the passages with a conductive material. A second conductive via 634 may extend through the common electrode 620, layer(s) of light filter 622, and layer(s) of dielectric 624. The second conductive via 634 may be electrically connected to the first conductive via 632 at one end, and to a pixel electrode in the set of pixel electrodes 630 at the other end.

In some cases, the first photosensitive material 618 may have a first type, and the second photosensitive material 628 may have a second type different from the first type (e.g., the first photosensitive material 618 may be configured to sense infrared light (e.g., near infrared (NIR) light, such as NIR light greater than 750 nm, or greater than 1100 nm, or greater than 1310 nm, or greater than 1550 nm), and the second photosensitive material 628 may be configured to sense visible light).

A common electrode 636 may be electrically connected to a surface or surfaces of the second photosensitive material 628, opposite surfaces of the second photosensitive material 628 to which the set of pixel electrodes 630 is electrically connected. The common electrode 636 may extend over the second photosensitive material 628 and portions (walls) of the dielectric 624. The common electrode 636 may be deposited over the second photosensitive material 628 and walls of the dielectric 624. The second photosensitive material 628 may then be patterned, using photoresist and the common electrode 636 as an etch mask. The common electrode 636 protects the second photosensitive material 628 from etch damage (e.g., because the second photosensitive material 628 is surrounded—or mostly surrounded—by the dielectric 624 and the common electrode 636). The common electrode 636 may include, for example ITO, IWO, and/or IGZO.

A passivation layer 638 may be deposited on the common electrode 636 and extend past edges of the common electrode 636. A light filter array 640 may be formed on the passivation layer 638. In some cases, the light filter array 640 may include a mix of visible light filters (e.g., red, green, and blue filters distributed in a Bayer color filter pattern).

An array of lenses 642 (e.g., a micro-lens array or GRIN lens array) may be disposed over, and in some cases may be aligned with, the different filters of the light filter array 640.

Although the electronic device 600 is shown to include a limited number of pixels, the number of pixels may be expanded to 100s, 1000s, or millions of pixels. Conversely, the electronic device 600 may have fewer pixels than shown.

Figure 7:
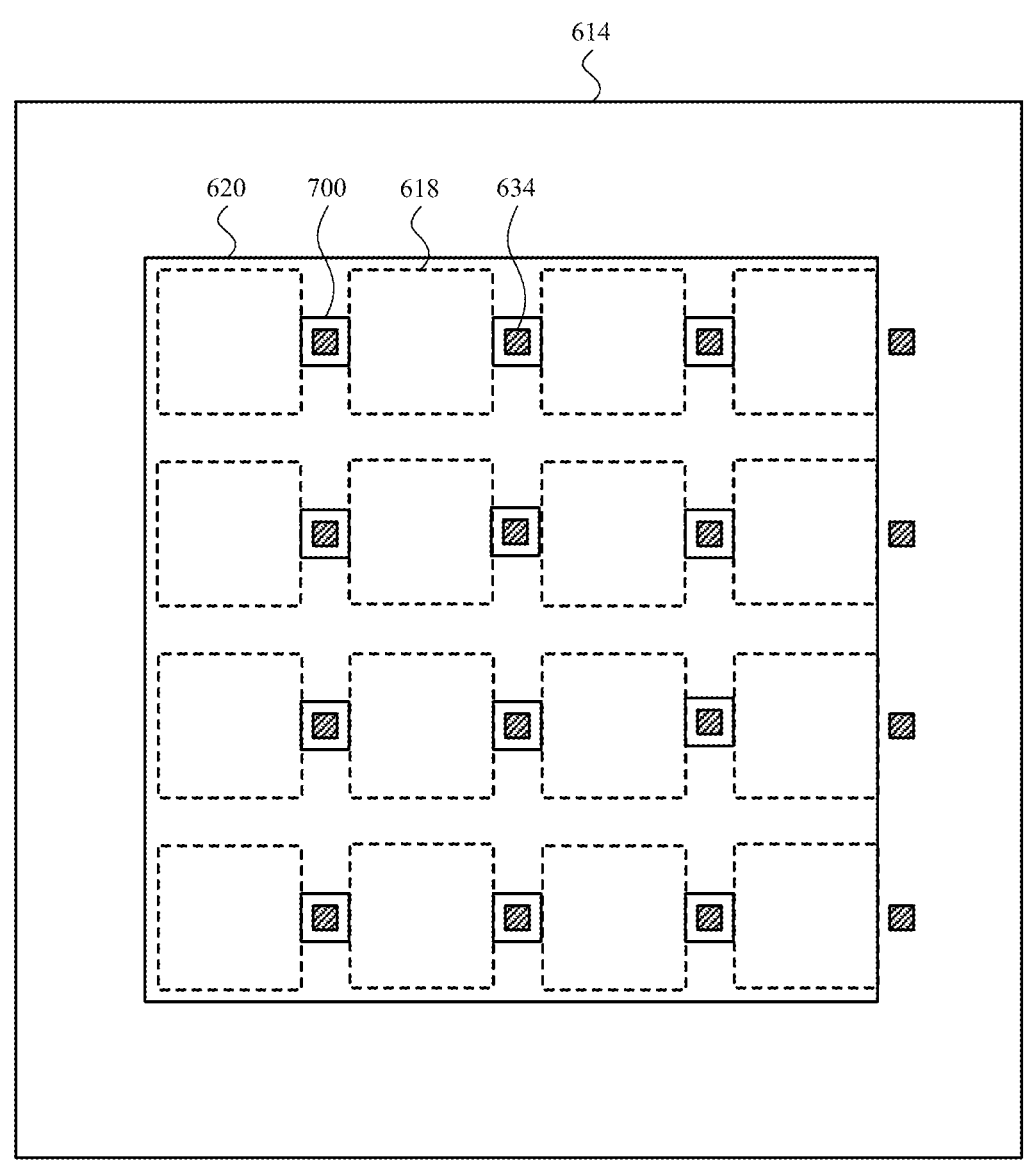
FIG. 7 shows an example cross-section of the electronic device shown in FIG. 6, taken along line VII-VII through the common electrode for the first photosensitive material.

FIG. 7 shows an example cross-section of the electronic device 600, taken along line VII-VII through the common electrode 620 for the first photosensitive material 618. As shown, the common electrode 620 may be patterned with holes 700 through which the conductive vias 634 extend. The conductive vias 634 may be electrically connected to the conductive vias 632 that extend through the grid of dielectric walls formed by the dielectric 614.

Each of the photosensitive materials 618, 628 may have different properties (e.g., be configured to sense different wavelengths of light). Pixel circuitry for both of the photosensitive materials 618, 628 may be included in a single set of epitaxial layers 604 (i.e., in a single epitaxial stack). By providing different photosensitive materials 618, 628 in different layers, each photosensitive material 618, 628 may be subdivided into a full array of pixels (in comparison to the photosensitive material arrays described with reference to FIGS. 2 and 4, which require each of the infrared and visible pixel arrays to leave spaces in an array for pixels of the other type).

Figure 8:
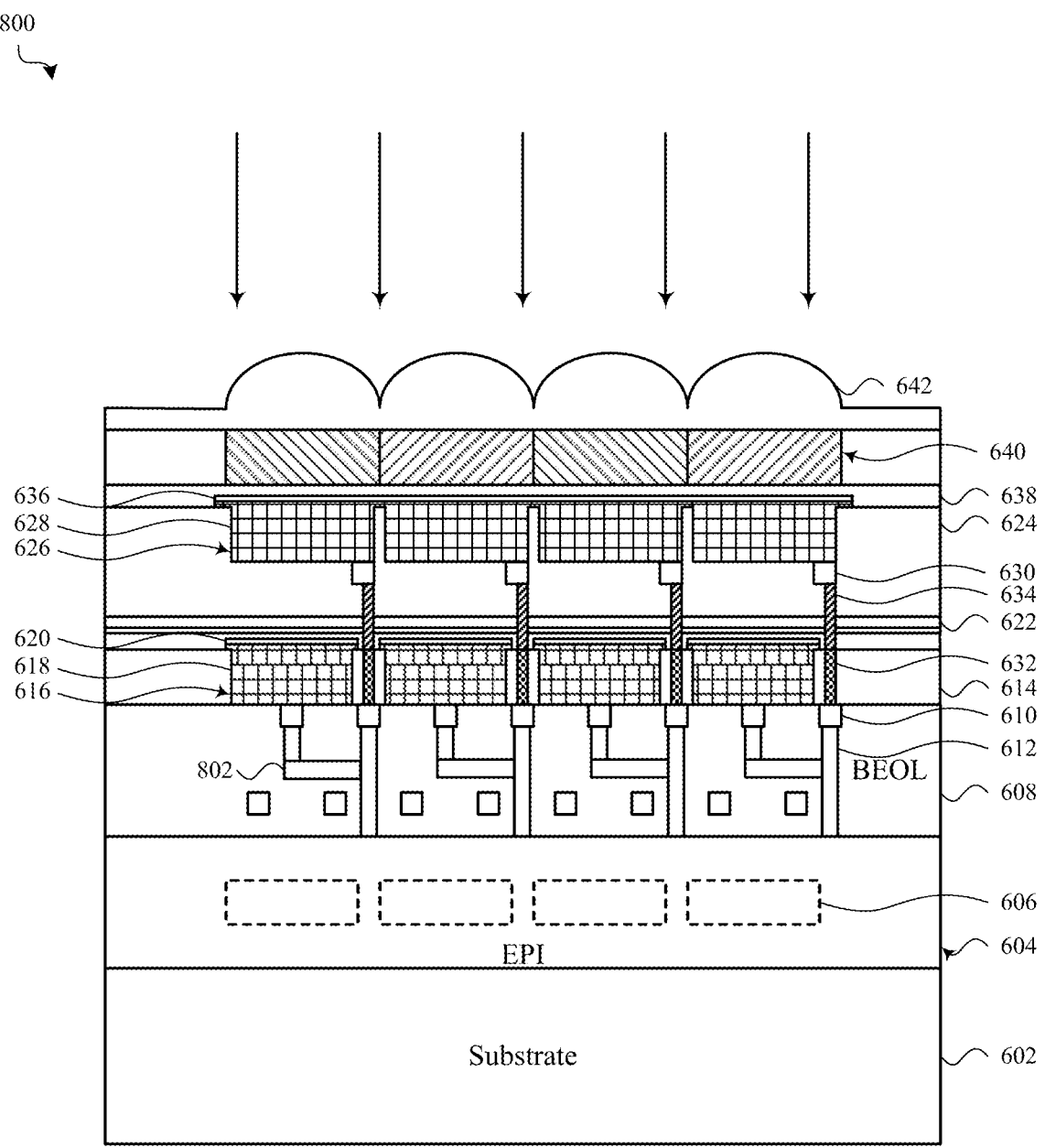
FIG. 8 shows a fifth example of an electronic device.

FIG. 8 shows a fifth example of an electronic device 800 (e.g., an image sensor). The electronic device 800 may be the electronic device described with reference to FIG. 1 or another form of electronic device. The electronic device 800 may be a stand-alone device or a device that can be integrated into another electronic device (e.g., a smartphone, an electronic watch, a tablet computer, a vehicle or vehicle navigation system, and so on). The electronic device 800 is in many ways similar to the electronic device described with reference to FIG. 6, and similar components are numbered using the same reference numerals in FIGS. 6 and 8.

The electronic device 800 described with reference to FIG. 8 differs from the electronic device described with reference to FIG. 7 in two significant ways. A first difference is that the first and second photosensitive materials 618, 628 of the electronic device 800 are the same type of photosensitive material. By way of example, both of the photosensitive materials 618, 628 may be photosensitive materials that are configured to sense visible light. A second difference is that portions of the photosensitive materials 618, 628 that define lower and upper cascaded (e.g., stacked or overlapping) pixels are electrically ganged together by electrical connections (conductors 802) in the BEOL metal. In this manner, the cascaded, ganged pixels may be capable of achieving a higher QE per pixel than a single layer pixel. A higher QE is especially helpful if a photosensitive medium is a photosensitive medium (e.g., an OPD) that is known to have slower charge separation (with potential electron/hole recombination before charge can reach a pixel electrode). A thinner photosensitive medium can provide for more complete charge collection. The cascaded photosensitive materials 618, 628 that are ganged to form a pixel may also be made thinner than a single, thicker photosensitive material, which can reduce mechanical stress and reduce peeling, photo-response non-uniformity (PRNU), and other defects and/or irregularities. Also, with a thinner photosensitive material, a lower bias is needed to collect photocurrent, which reduces operating bias stresses on a photosensitive material. Less photocurrent per film also reduces photocurrent stresses on a photosensitive material, during and outside sensor integration.

Figure 9:
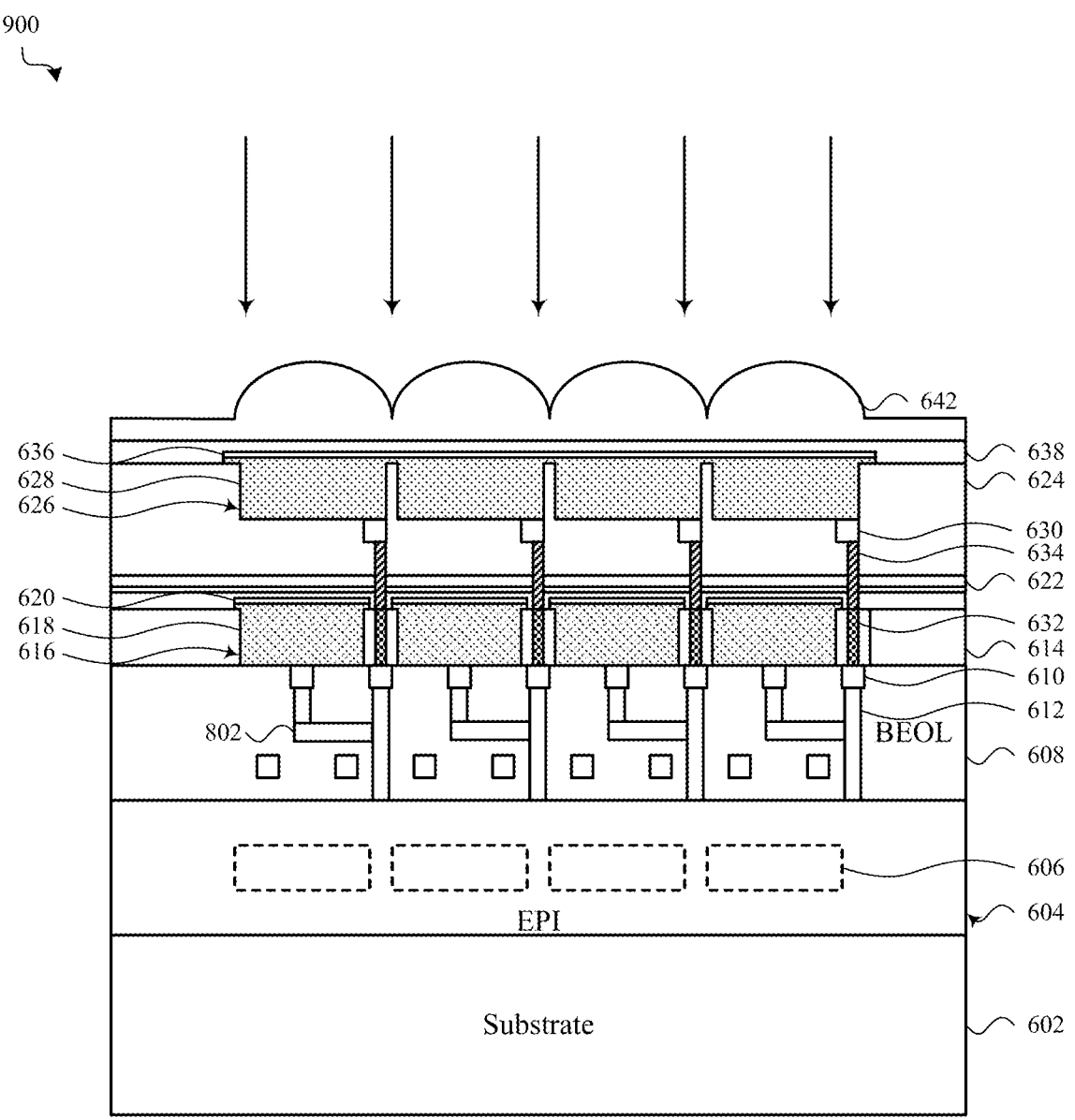
FIG. 9 shows a sixth example of an electronic device.

FIG. 9 shows a sixth example of an electronic device 900 (e.g., an image sensor). The electronic device 900 may be the electronic device described with reference to FIG. 1 or another form of electronic device. The electronic device 900 may be a stand-alone device or a device that can be integrated into another electronic device (e.g., a smartphone, an electronic watch, a tablet computer, a vehicle or vehicle navigation system, and so on). The electronic device 900 is in many ways similar to the electronic device described with reference to FIG. 8, and similar components are numbered using the same reference numerals in FIGS. 8 and 9.

The electronic device 900 described with reference to FIG. 9 differs from the electronic device described with reference to FIG. 7 in that it does not include a light filter array 640. The light filter array 640 may not be needed if, for example, all of the pixels of the first and second photosensitive materials 618, 628 are configured to sense the same wavelength(s) of light, such as infrared light (e.g., near infrared (NIR) light, such as NIR light greater than 750 nm, or greater than 1100 nm, or greater than 1310 nm, or greater than 1550 nm).

Figure 10:
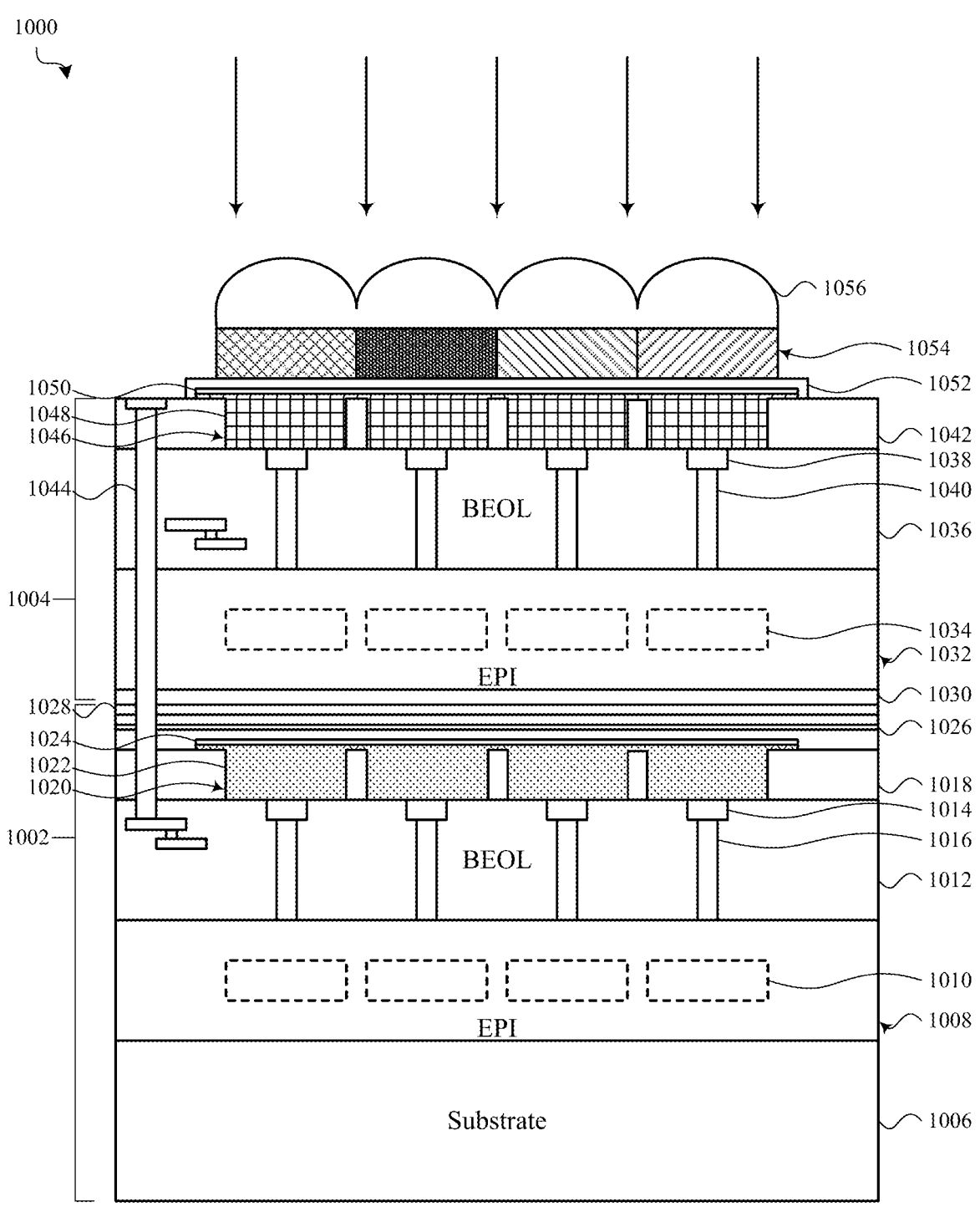
FIG. 10 shows a seventh example of an electronic device.

FIG. 10 shows a seventh example of an electronic device 1000 (e.g., an image sensor). The electronic device 1000 may be the electronic device described with reference to FIG. 1 or another form of electronic device. The electronic device 1000 may be a stand-alone device or a device that can be integrated into another electronic device (e.g., a smartphone, an electronic watch, a tablet computer, a vehicle or vehicle navigation system, and so on). The electronic device 1000 is in many ways similar to the electronic device described with reference to FIG. 6, but instead of including several components that are grown or deposited on a single substrate, the electronic device includes components that are grown or deposited on two different substrates before being stacked.

The electronic device 1000 may include a first chip 1002 and a second chip 1004. The first chip 1002 may be formed similarly to the electronic device described with reference to FIG. 6, up to and optionally including the layer(s) of dielectric 1028. For example, the first chip 1002 may include a semiconductor substrate 1006 (e.g., a Si substrate) on which a set of epitaxial layers 1008 is formed (e.g., grown). Pixel circuitry 1010 may be included in the set of epitaxial layers 1008. The pixel circuitry 1010 may include, for example, analog and/or digital CMOS circuitry (e.g., charge processing and charge converting circuitry, including analog-to-digital converters and so on).

BEOL metal layers and oxides 1012 may be formed on the set of epitaxial layers 1008 (e.g., on one or more surfaces of the set of epitaxial layers 1008, opposite the semiconductor substrate 1006). A set of pixel electrodes 1014 may be formed on one or more surfaces of the BEOL metal layers and oxides 1012, opposite the set of epitaxial layers 1008. A set of conductive vias 1016 may extend through the BEOL metal layers and oxides 1012 may electrically connect the set of pixel electrodes 1014 to the pixel circuitry 1010 (e.g., different pixel electrodes in the set of pixel electrodes 1014, and may be electrically connected to different sets of pixel circuitry associated with different pixels of an image sensor).

One or more layers of dielectric 1018, such as one or more layers of oxide (e.g., $SiO_2$) may be deposited on the BEOL metal layers and oxides 1012 and set of pixel electrodes 1014. In some cases, the layer(s) of dielectric 1018 may be deposited as a contiguous layer, and then portions of the dielectric 1018 may be etched away to form one or more cavities 1020 (e.g., trenches, such as generally rectangular or square trenches) bounded by a set of dielectric walls (e.g., a set of dielectric walls or grid of dielectric walls defining the one or more cavities 1020). Formation of the cavities 1020 (or a secondary process) may expose the set of pixel electrodes 1014 to the one or more cavities 1020.

A first photosensitive material 1022 may be deposited in the one or more cavities 1020. The first photosensitive material 1022 may overfill and extend past, and over, the walls of the cavities 1020.

The deposition of the first photosensitive material 1022 may electrically connect the set of pixel electrodes 1014 to the first photosensitive material 1022. A common electrode 1024 may be electrically connected to surfaces of the first photosensitive material 1022, opposite surfaces of the first photosensitive material 1022 to which the set of pixel electrodes 1014 are electrically connected. The common electrode 1024 may extend over the first photosensitive material 1022 and portions (walls) of the dielectric 1018. The common electrode 1024 may be deposited over the first photosensitive material 1022 and the dielectric walls formed by the dielectric 1018. The first photosensitive material 1022 may then be patterned, using photoresist and the common electrode 1024 as an etch mask. The common electrode 1024 protects both the first photosensitive material from etch damage (e.g., because the first photosensitive material 1022 is surrounded—or mostly surrounded—by the dielectric 1018 and the common electrode 1024). The common electrode 1024 may include, for example ITO, IWO, and/or IGZO.

Optionally, one or more layers of light filter 1026 may be deposited over the common electrode 1024, to filter out or block light that the first photosensitive material is not configured to sense. For example, if the first photosensitive material 1022 is configured to detect infrared light, the layer(s) of light filter 1026 may be configured to filter out or block visible light and/or other non-infrared light.

One or more additional layers of dielectric 1028, such as one or more layers of oxide (e.g., $SiO_2$) may be deposited on the layer(s) of light filter 1026 (or if the layer(s) of light filter 1026 are not used, the layer(s) of dielectric 1028 may be deposited on the common electrode 1024, or on a passivation layer positioned where the layer(s) of light filter 1026 are shown).

The second chip 1004 may also be formed similarly to the electronic device described with reference to FIG. 6, up to and including the common electrode 1050. For example, the second chip 1004 may include a semiconductor substrate 1030 (e.g., a Si substrate) on which a set of epitaxial layers 1032 is formed (e.g., grown). Pixel circuitry 1034 may be included in the set of epitaxial layers 1032. The pixel circuitry 1034 may include, for example, analog and/or digital CMOS circuitry (e.g., charge processing and charge converting circuitry (e.g., analog-to-digital converters)).

BEOL metal layers and oxides 1036 may be formed on the set of epitaxial layers 1032 (e.g., on one or more surfaces of the set of epitaxial layers 1032, opposite the semiconductor substrate 1030). A set of pixel electrodes 1038 may be formed on one or more surfaces of the BEOL metal layers and oxides 1036, opposite the set of epitaxial layers 1032. A set of conductive vias 1040 may extend through the BEOL metal layers and oxides 1036 and may electrically connect the set of pixel electrodes 1038 to the pixel circuitry 1034 (e.g., different pixel electrodes in the set of pixel electrodes 1038 may be electrically connected to different sets of pixel circuitry associated with different pixels of an image sensor).

One or more layers of dielectric 1042, such as one or more layers of oxide (e.g., $SiO_2$) may be deposited on the BEOL metal layers and oxides 1036 and set of pixel electrodes 1038. In some cases, the layer(s) of dielectric 1042 may be deposited as a contiguous layer, and before portions of the dielectric 1042 are etched away to form one or more cavities, the second chip 1004 may be attached to a carrier wafer via the dielectric 1042. The semiconductor substrate 1030 may then be thinned or removed and the semiconductor substrate 1030 of the second chip 1004 may be bonded to the layer(s) of dielectric 1028 of the first chip 1002. Through-silicon vias (TSVs) 1044 may be formed or connected to route conductors of the electronic device 1000 to a common external surface (e.g., to a light-receiving or top surface of the electronic device 1000 (as shown), or to a bottom or edge of the electronic device 1000).

After bonding the second chip 1004 to the first chip 1002 and forming or connecting TSVs 1044, portions of the dielectric 1042 may be etched away to form one or more cavities 1046 (e.g., trenches, such as generally rectangular or square trenches) bounded by a set of dielectric walls (e.g., a set of dielectric walls or grid of dielectric walls defining the one or more cavities 1046). Formation of the cavities 1046 (or a secondary process) may expose the set of pixel electrodes 1038 to the one or more cavities 1046.

A second photosensitive material 1048 may be deposited in the one or more cavities 1046. The second photosensitive material 1048 may overfill and extend past, and over, the walls of the cavities 1046.

The deposition of the second photosensitive material 1048 may electrically connect the set of pixel electrodes 1038 to the second photosensitive material 1048. A common electrode 1050 may be electrically connected to surfaces of the second photosensitive material 1048, opposite surfaces of the second photosensitive material 1048 to which the set of pixel electrodes 1038 are electrically connected. The common electrode 1050 may extend over the second photosensitive material 1048 and portions (walls) of the dielectric 1042. The common electrode 1050 may be deposited over the second photosensitive material 1048 and the dielectric walls formed by the dielectric 1042. The second photosensitive material 1048 may then be patterned, using photoresist and the common electrode 1050 as an etch mask. The common electrode 1050 protects both the first photosensitive material from etch damage (e.g., because the second photosensitive material 1048 is surrounded—or mostly surrounded—by the dielectric 1042 and the common electrode 1050). The common electrode 1050 may include, for example ITO, IWO, and/or IGZO.

A passivation layer 1052 may be deposited on the common electrode 1050 and extend past edges of the common electrode 1050. A light filter array 1054 may be formed on the passivation layer 1052. In some cases, the light filter array 1054 may include a mix of visible light filters (e.g., red, green, and blue filters distributed in a Bayer color filter pattern).

An array of lenses 1056 (e.g., a micro-lens array or GRIN lens array) may be disposed over, and in some cases may be aligned with, the different filters of the light filter array 1054.

Although the electronic device 1000 is shown to include a limited number of pixels, the number of pixels may be expanded to 100s, 1000s, or millions of pixels. Conversely, the electronic device 1000 may have fewer pixels than shown.

An advantage of the electronic device 1000 is that the size of the pixels formed in the first photosensitive material 1022 need not be the same size or smaller than pixels of the second photosensitive material 1048. That is, because the electrical interconnect for the second photosensitive material 1048 is not routed through the dielectric walls of the dielectric 1018, the pixel size defined in the first photosensitive material 1022 may be larger than the pixel size defined in the second photosensitive material 1048.

Figure 11A:
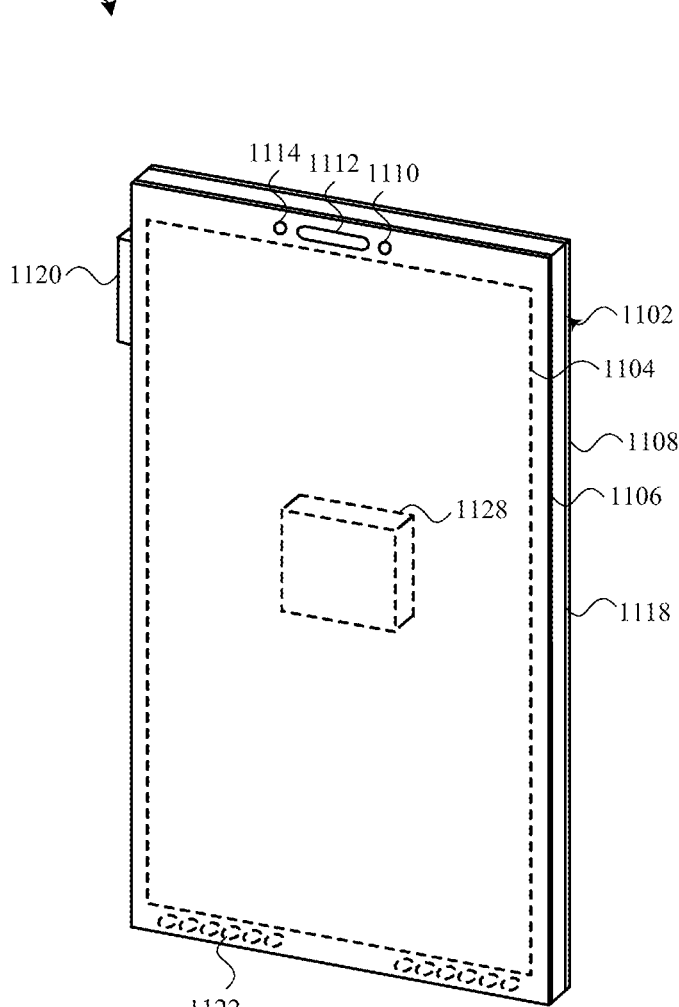
FIGS. 11A and 11B show an example of a device (an electronic device) that includes a set of image sensors (or cameras)
Figure 11B:
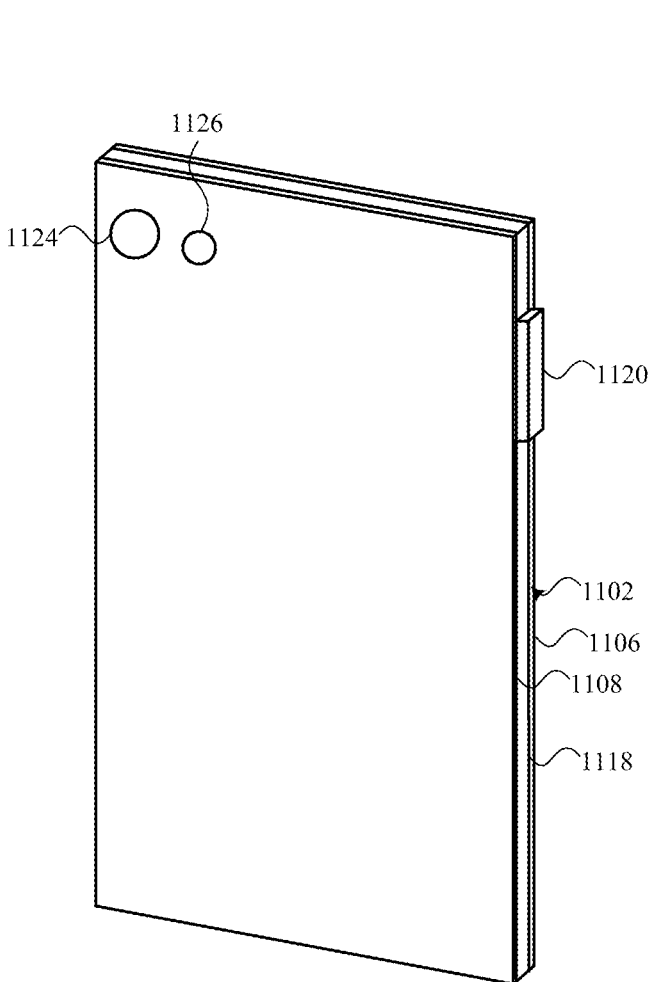

FIGS. 11A and 11B show an example of a device 1100 (an electronic device) that includes a set of image sensors (or cameras). The device's dimensions and form factor, including the ratio of the length of its long sides to the length of its short sides, suggest that the device 1100 is a mobile phone (e.g., a smartphone). However, the device's dimensions and form factor are arbitrarily chosen, and the device 1100 could alternatively be any portable electronic device including, for example a mobile phone, tablet computer, portable computer, portable music player, portable terminal, vehicle navigation system, robot navigation system, or other portable or mobile device. The device 1100 could also be a device that is semi-permanently located (or installed) at a single location (e.g., a door lock, thermostat, refrigerator, or other appliance). FIG. 11A shows a front isometric view of the device 1100, and FIG. 11B shows a rear isometric view of the device 1100. The device 1100 may include a housing 1102 that at least partially surrounds a display 1104. The housing 1102 may include or support a front cover 1106 or a rear cover 1108. The front cover 1106 may be positioned over the display 1104, and may provide a window through which the display 1104 (including images displayed thereon) may be viewed by a user. In some embodiments, the display 1104 may be attached to (or abut) the housing 1102 and/or the front cover 1106.

The display 1104 may include one or more light-emitting elements or pixels, and in some cases may be a light-emitting diode (LED) display, an organic LED (OLED) display, a liquid crystal display (LCD), an electroluminescent (EL) display, a laser projector, or another type of electronic display. In some embodiments, the display 1104 may include, or be associated with, one or more touch and/or force sensors that are configured to detect a touch and/or a force applied to a surface of the front cover 1106.

The various components of the housing 1102 may be formed from the same or different materials. For example, a sidewall 1118 of the housing 1102 may be formed using one or more metals (e.g., stainless steel), polymers (e.g., plastics), ceramics, or composites (e.g., carbon fiber). In some cases, the sidewall 1118 may be a multi-segment sidewall including a set of antennas. The antennas may form structural components of the sidewall 1118. The antennas may be structurally coupled (to one another or to other components) and electrically isolated (from each other or from other components) by one or more non-conductive segments of the sidewall 1118. The front cover 1106 may be formed, for example, using one or more of glass, a crystal (e.g., sapphire), or a transparent polymer (e.g., plastic) that enables a user to view the display 1104 through the front cover 1106. In some cases, a portion of the front cover 1106 (e.g., a perimeter portion of the front cover 1106) may be coated with an opaque ink to obscure components included within the housing 1102. The rear cover 1108 may be formed using the same material(s) that are used to form the sidewall 1118 or the front cover 1106, or may be formed using a different material or materials. In some cases, the rear cover 1108 may be part of a monolithic element that also forms the sidewall 1118 (or in cases where the sidewall 1118 is a multi-segment sidewall, those portions of the sidewall 1118 that are non-conductive). In still other embodiments, all of the exterior components of the housing 1102 may be formed from a transparent material, and components within the device 1100 may or may not be obscured by an opaque ink or opaque structure within the housing 1102.

The front cover 1106 may be mounted to the sidewall 1118 to cover an opening defined by the sidewall 1118 (i.e., an opening into an interior volume in which various electronic components of the device 1100, including the display 1104, may be positioned). The front cover 1106 may be mounted to the sidewall 1118 using fasteners, adhesives, seals, gaskets, or other components.

A display stack or device stack (hereafter referred to as a "stack") including the display 1104 (and in some cases the front cover 1106) may be attached (or abutted) to an interior surface of the front cover 1106 and extend into the interior volume of the device 1100. In some cases, the stack may also include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 1106 (e.g., to a display surface of the device 1100).

In some cases, a force sensor (or part of a force sensor system) may be positioned within the interior volume below and/or to the side of the display 1104 (and in some cases within the stack). The force sensor (or force sensor system) may be triggered in response to the touch sensor detecting one or more touches on the front cover 1106 (or indicating a location or locations of one or more touches on the front cover 1106), and may determine an amount of force associated with each touch, or an amount of force associated with the collection of touches as a whole.

As shown primarily in FIG. 11A, the device 1100 may include various other components. For example, the front of the device 1100 may include one or more front-facing cameras 1110 (including one or more image sensors), speakers 1112, microphones, or other components 1114 (e.g., audio, imaging, and/or sensing components) that are configured to transmit or receive signals to/from the device 1100. In some cases, a front-facing camera 1110, alone or in combination with other sensors, may be configured to operate as a bio-authentication or facial recognition sensor. In some embodiments, the front-facing camera 1110 may be positioned behind, and may capture an image through, the display 1104.

The device 1100 may also include buttons or other input devices positioned along the sidewall 1118 and/or on a rear surface of the device 1100. For example, a volume button or multipurpose button 1120 may be positioned along the sidewall 1118, and in some cases may extend through an aperture in the sidewall 1118. The sidewall 1118 may include one or more ports 1122 that allow air, but not liquids, to flow into and out of the device 1100. In some embodiments, one or more sensors may be positioned in or near the port(s) 1122. For example, an ambient pressure sensor, ambient temperature sensor, internal/external differential pressure sensor, gas sensor, particulate matter concentration sensor, or air quality sensor may be positioned in or near a port 1122.

In some embodiments, the rear surface of the device 1100 may include a rear-facing camera 1124. A flash or light source 1126 may also be positioned along the rear of the device 1100 (e.g., near the rear-facing camera). In some cases, the rear surface of the device 1100 may include multiple rear-facing cameras.

The device 1100 may include circuitry 1128 (e.g., a processor and/or other components) configured to control one or more of the display 1104, front-facing camera 1110, speakers 1112, microphones, other components 1114, button 1120, rear-facing camera 1124, or light source 1126, among other elements of the device 1100 or devices with which the device 1100 may communicate.

In some embodiments, the front or rear-facing camera 1110 or 1124 may be configured similarly to any of the electronic devices or image sensors described with reference to FIGS. 1-10.

Figure 12:
FIG. 12 shows a sample electrical block diagram of an electronic device.
Figure 12:
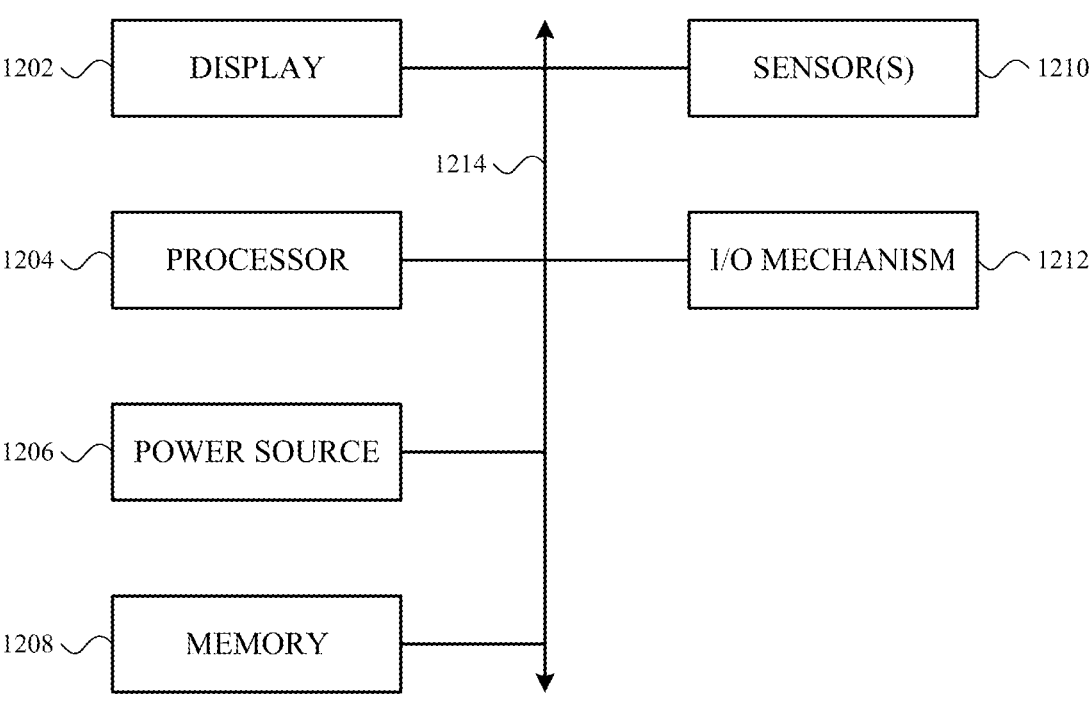

FIG. 12 shows a sample electrical block diagram of an electronic device 1200, which electronic device may in some cases be the device described with reference to FIGS. 11A-11B. The electronic device 1200 may include an optional electronic display 1202 (e.g., a light-emitting display), a processor 1204, a power source 1206, a memory 1208 or storage device, a sensor system 1210, or an input/ output (I/O) mechanism 1212 (e.g., an input/output device, input/output port, or haptic input/output interface). The processor 1204 may control some or all of the operations of the electronic device 1200. The processor 1204 may communicate, either directly or indirectly, with some or all of the other components of the electronic device 1200. For example, a system bus or other communication mechanism 1214 can provide communication between the electronic display 1202, the processor 1204, the power source 1206, the memory 1208, the sensor system 1210, and the I/O mechanism 1212.

The processor 1204 may be implemented as any electronic device capable of processing, receiving, or transmitting data or instructions, whether such data or instructions is in the form of software or firmware or otherwise encoded. For example, the processor 1204 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements. In some cases, the processor 1204 may provide part or all of the circuitry described with reference to FIGS. 9A-9B.

It should be noted that the components of the electronic device 1200 can be controlled by multiple processors. For example, select components of the electronic device 1200 (e.g., the sensor system 1210) may be controlled by a first processor and other components of the electronic device 1200 (e.g., the electronic display 1202) may be controlled by a second processor, where the first and second processors may or may not be in communication with each other.

The power source 1206 can be implemented with any device capable of providing energy to the electronic device 1200. For example, the power source 1206 may include one or more batteries or rechargeable batteries. Additionally or alternatively, the power source 1206 may include a power connector or power cord that connects the electronic device 1200 to another power source, such as a wall outlet.

The memory 1208 may store electronic data that can be used by the electronic device 1200. For example, the memory 1208 may store electrical data or content such as, for example, audio and video files, documents and applications, device settings and user preferences, timing signals, control signals, and data structures or databases. The memory 1208 may include any type of memory. By way of example only, the memory 1208 may include random access memory, read-only memory, Flash memory, removable memory, other types of storage elements, or combinations of such memory types.

The electronic device 1200 may also include a sensor system 1210, including sensors positioned almost anywhere on the electronic device 1200. In some cases, the sensor system 1210 may include one or more cameras or image sensors, positioned and/or configured as described with reference to any of FIGS. 1-11B. The sensor system 1210 may be configured to sense one or more type of parameters, such as but not limited to, vibration; light; touch; force; heat; movement; relative motion; biometric data (e.g., biological parameters) of a user; air quality; proximity; position; connectedness; matter type; and so on. By way of example, the sensor system 1210 may include one or more of (or multiple of) a heat sensor, a position sensor, a proximity sensor, a light or optical sensor (e.g., an electromagnetic radiation emitter and/or detector), an accelerometer, a pressure transducer, a gyroscope, a magnetometer, a health monitoring sensor, and an air quality sensor, and so on. Additionally, the sensor system 1210 may utilize any suitable sensing technology, including, but not limited to, interferometric, magnetic, pressure, capacitive, ultrasonic, resistive, optical, acoustic, piezoelectric, or thermal technologies.

The I/O mechanism 1212 may transmit or receive data from a user or another electronic device. The I/O mechanism 1212 may include the electronic display 1202, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1212 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. An image sensor, comprising:
a semiconductor substrate;
a set of epitaxial layers formed on the semiconductor substrate;
pixel circuitry included within the set of epitaxial layers;
a set of dielectric walls formed on the set of epitaxial layers;
a first set of photosensitive materials disposed in a first one or more layers, wherein the first set of photosensitive materials is disposed in one or more cavities formed by the set of dielectric walls and electrically connected to the pixel circuitry;
a second set of photosensitive materials disposed in a planar array in a second one or more layers, wherein the second set of photosensitive materials is positioned above the first set of photosensitive materials;
a color filter array positioned above the second set of photosensitive materials;
a visible light blocking filter positioned between the first set of photosensitive materials and the second set of photosensitive materials;
a first conductive via extending through the first one or more layers and electrically connected to the pixel circuitry; and
a second conductive via extending through the second one or more layers and electrically connected to the first conductive via, wherein:
the first conductive via and the second conductive via electrically connect the pixel circuitry to a photosensitive material of the second set of photosensitive materials.

2. The image sensor of claim 1, wherein:
the set of dielectric walls forms a grid of dielectric walls;
the grid of dielectric walls defines a set of cavities;

a first photosensitive material in the first set of photosensitive materials is disposed in a first cavity in the set of cavities; and a second photosensitive material in the first set of photosensitive materials is disposed in a second cavity in the set of cavities.

3. The image sensor of claim 2, further comprising:

a set of pixel electrodes electrically connected to the first set of photosensitive materials; and a common electrode electrically connected to the first set of photosensitive materials and extending over,
    the first set of photosensitive materials; and
    walls in the set of dielectric walls bordering the first set of photosensitive materials, wherein:
        the second conductive via extends through the common electrode.

4. The image sensor of claim 1, wherein the first set of photosensitive materials and the second one or more photosensitive materials comprise a same type of photosensitive material.

5. The image sensor of claim 1, wherein:

the first set of photosensitive materials comprises a first type of photosensitive material; and the second set of photosensitive materials comprises a second type of photosensitive material, different from the first type of photosensitive material.

6. The image sensor of claim 1, further comprising:

a set of conductive vias extending through the set of dielectric walls and forming portions of electrical connections between the second set of photosensitive materials and the pixel circuitry, wherein the set of conductive vias includes the first conductive via.

7. The image sensor of claim 1, further comprising:

a set of conductive vias extending through the set of dielectric walls and forming portions of electrical connections between the second one or more photosensitive materials and the first set of photosensitive materials.

8. The image sensor of claim 1, wherein:

the set of dielectric walls forms a grid of dielectric walls;

the grid of dielectric walls forms a set of cavities;

the first set of photosensitive materials is disposed in the set of cavities;

a set of pixel electrodes corresponding to the first set of photosensitive materials and forming portions of electrical connections between the first set of photosensitive materials and the pixel circuitry; and a common electrode electrically coupled to multiple photosensitive materials in the first set of photosensitive materials and extending over,
    the multiple photosensitive materials; and
    walls in the set of dielectric walls bordering the multiple photosensitive materials.

9. The image sensor of claim 1, further comprising:

a set of pixel electrodes forming a set of first portions of electrical connections between the second one or more photosensitive materials and the pixel circuitry;

a set of conductive vias extending through the set of dielectric walls and forming a set of second portions of electrical connections between the second set of photosensitive materials and the pixel circuitry; and a common electrode electrically coupled to the second set of photosensitive materials and extending over:
    the second set of photosensitive materials; and
    a dielectric bordering the second set of photosensitive materials.

10. An electronic device, comprising:

at least one layer comprising pixel circuitry;

a first set of one or more layers stacked with the at least one layer comprising pixel circuitry and including,
    a grid of dielectric walls defining a set of cavities; and
    a first set of photosensitive materials disposed in the set of cavities;

a first set of electrical connections between the first set of photosensitive materials and the pixel circuitry;

a second set of one or more layers stacked with the at least one layer comprising pixel circuitry and the first set of one or more layers and including,
    a set of dielectric walls defining at least one cavity; and
    a second one or more photosensitive materials disposed in the at least one cavity;

a color filter array positioned above the second set of photosensitive materials;

a visible light blocking filter positioned between the first set of photosensitive materials and the second one or more photosensitive materials; and a second set of electrical connections between the second one or more photosensitive materials and the pixel circuitry, the second set of electrical connections including a set of conductive vias extending through the set of dielectric walls, wherein:

the set of conductive via comprises a first conductive via;

an electrical connection of the second set of electrical connections comprises:
    the first conductive via;
    a second conductive via extending through the second set one or more layers and electrically connected each of the first conductive via and a photosensitive material of the second one or more photosensitive materials.

11. The electronic device of claim 10, further comprising:

a semiconductor substrate; and a set of epitaxial layers stacked on the semiconductor substrate and including the at least one layer comprising the pixel circuitry.

* * * * *